US009172336B2

(12) United States Patent
Briffa et al.

(10) Patent No.: US 9,172,336 B2
(45) Date of Patent: Oct. 27, 2015

(54) METHOD AND APPARATUS FOR MULTILEVEL POWER AMPLIFICATION

(71) Applicant: Eta Devices, Inc., Cambridge, MA (US)

(72) Inventors: Mark A. Briffa, Tyreso (SE); Joel L. Dawson, Roslindale, MA (US); John E. DeRoo, Hopkinton, MA (US); Krenar Komoni, Waltham, MA (US); David J. Perreault, Brookline, MA (US); Oguzhan Uyar, Cambridge, MA (US)

(73) Assignee: Ela Devices, Inc., Cambridge, MA (US)

( * ) Notice: Subject to any disclaimer, the term of this patent is extended or adjusted under 35 U.S.C. 154(b) by 12 days.

(21) Appl. No.: 13/955,952

(22) Filed: Jul. 31, 2013

(65) Prior Publication Data

US 2014/0118072 A1    May 1, 2014

Related U.S. Application Data

(63) Continuation of application No. 13/833,050, filed on Mar. 15, 2013, now Pat. No. 8,829,993, which is a continuation-in-part of application No. 13/663,878, filed on Oct. 30, 2012, and a continuation-in-part of application No. 13/663,887, filed on Oct. 30, 2012, now Pat. No. 8,824,978.

(60) Provisional application No. 61/730,214, filed on Nov. 27, 2012.

(51) Int. Cl.
H03G 3/20 (2006.01)
H03F 3/193 (2006.01)
H03F 1/32 (2006.01)
H03F 3/68 (2006.01)
H03F 1/02 (2006.01)
H03F 3/195 (2006.01)

(Continued)

(52) U.S. Cl.
CPC ............... *H03F 3/193* (2013.01); *H03F 1/025* (2013.01); *H03F 1/3241* (2013.01); *H03F 1/3247* (2013.01); *H03F 3/195* (2013.01); *H03F 3/217* (2013.01); *H03F 3/245* (2013.01); *H03F 3/602* (2013.01); *H03F 3/68* (2013.01); *H03F 2200/511* (2013.01)

(58) Field of Classification Search
CPC ........................................................ H03G 3/20
USPC ......................... 330/136, 129, 285, 296, 297
See application file for complete search history.

(56) References Cited

U.S. PATENT DOCUMENTS 4,129,839 A   12/1978   Galani et al.
4,835,493 A    5/1989   Walsh, Jr.

(Continued)

FOREIGN PATENT DOCUMENTS

EP   1 750 366 A2   2/2007
EP   1 750 366 A3   2/2007

(Continued)

OTHER PUBLICATIONS

PCT Search Report of the ISA for PCT/US2013/065552 dated Mar. 20, 2014.

(Continued)

*Primary Examiner* — Henry Choe
(74) *Attorney, Agent, or Firm* — Daly, Crowley, Mofford & Durkee, LLP

(57) ABSTRACT

Circuits and methods for performing multilevel power amplification using multiple different supply voltages or states are disclosed. In some embodiments, power amplifiers are provided that switch between three or more supply voltages or states.

20 Claims, 10 Drawing Sheets

(51) Int. Cl.
*H03F 3/217* (2006.01)
*H03F 3/24* (2006.01)
*H03F 3/60* (2006.01)

(56) References Cited

U.S. PATENT DOCUMENTS

| | | | |
|---|---|---|---|
| 5,012,200 A | 4/1991 | Meinzer | |
| 5,561,395 A | 10/1996 | Melton et al. | |
| 5,847,602 A | 12/1998 | Su | |
| 5,892,395 A | 4/1999 | Stengel et al. | |
| 6,043,707 A | 3/2000 | Budnik | |
| 6,081,161 A | 6/2000 | Dacus et al. | |
| 6,133,288 A | 10/2000 | Grese | |
| 6,133,788 A | 10/2000 | Dent | |
| 6,140,807 A | 10/2000 | Vannatta et al. | |
| 6,255,906 B1 | 7/2001 | Eidson et al. | |
| 6,327,462 B1 | 12/2001 | Loke et al. | |
| 6,377,117 B2 | 4/2002 | Oskowsky et al. | |
| 6,396,341 B1 | 5/2002 | Pehlke | |
| 6,449,465 B1 | 9/2002 | Gailus et al. | |
| 6,535,066 B1 | 3/2003 | Petsko | |
| 6,566,944 B1 | 5/2003 | Pehlke et al. | |
| 6,738,432 B2 | 5/2004 | Pehlke et al. | |
| 6,788,151 B2 * | 9/2004 | Shvarts et al. | 330/297 |
| 6,799,020 B1 | 9/2004 | Heidmann et al. | |
| 6,975,166 B2 * | 12/2005 | Grillo et al. | 330/136 |
| 7,068,984 B2 | 6/2006 | Mathe et al. | |
| 7,091,772 B2 * | 8/2006 | Friedel et al. | 330/10 |
| 7,103,114 B1 | 9/2006 | Lapierre | |
| 7,236,542 B2 | 6/2007 | Matero | |
| 7,279,971 B2 | 10/2007 | Hellberg et al. | |
| 7,330,070 B2 | 2/2008 | Vaisanen | |
| 7,362,251 B2 | 4/2008 | Jensen et al. | |
| 7,411,449 B2 | 8/2008 | Klingberg et al. | |
| 7,423,477 B2 | 9/2008 | Sorrells et al. | |
| 7,440,733 B2 | 10/2008 | Maslennikov et al. | |
| 7,469,017 B2 | 12/2008 | Granstrom et al. | |
| 7,474,149 B2 * | 1/2009 | Snelgrove et al. | 330/136 |
| 7,482,869 B2 | 1/2009 | Wilson | |
| 7,505,747 B2 | 3/2009 | Solum | |
| 7,512,387 B2 | 3/2009 | Glueck | |
| 7,535,133 B2 | 5/2009 | Perreault et al. | |
| 7,555,059 B2 | 6/2009 | Rybicki et al. | |
| 7,583,149 B2 * | 9/2009 | Funaki et al. | 330/297 |
| 7,589,605 B2 | 9/2009 | Perreault et al. | |
| 7,705,681 B2 | 4/2010 | Ilkov | |
| 7,715,811 B2 | 5/2010 | Kenington | |
| 7,889,519 B2 | 2/2011 | Perreault et al. | |
| 7,956,572 B2 | 6/2011 | Zane et al. | |
| 7,962,111 B2 | 6/2011 | Solum | |
| 8,009,765 B2 | 8/2011 | Ahmed et al. | |
| 8,026,763 B2 | 9/2011 | Dawson et al. | |
| 8,072,264 B2 | 12/2011 | Gustavsson | |
| 8,155,237 B2 | 4/2012 | Ahmed | |
| 8,164,384 B2 | 4/2012 | Dawson et al. | |
| 8,174,322 B2 | 5/2012 | Heijden et al. | |
| 8,212,541 B2 | 7/2012 | Perreault et al. | |
| 8,315,578 B2 | 11/2012 | Zhu et al. | |
| 8,340,606 B2 | 12/2012 | Park et al. | |
| 8,416,018 B2 | 4/2013 | Yamauchi et al. | |
| 8,447,245 B2 | 5/2013 | Staudinger et al. | |
| 8,451,053 B2 | 5/2013 | Perreault et al. | |
| 8,493,142 B2 | 7/2013 | Tadano | |
| 8,536,940 B2 | 9/2013 | Bohn et al. | |
| 8,542,061 B2 | 9/2013 | Levesque et al. | |
| 8,610,499 B2 | 12/2013 | Royer | |
| 8,611,459 B2 | 12/2013 | McCallister | |
| 8,659,353 B2 | 2/2014 | Dawson et al. | |
| 8,718,188 B2 | 5/2014 | Balteanu et al. | |
| 8,773,201 B2 | 7/2014 | Yamamoto et al. | |
| 8,995,502 B1 | 3/2015 | Lai et al. | |
| 2003/0146791 A1 | 8/2003 | Shvarts et al. | |
| 2004/0100323 A1 | 5/2004 | Khanifar et al. | |
| 2004/0251964 A1 | 12/2004 | Weldon | |
| 2005/0062529 A1 | 3/2005 | Gan et al. | |
| 2005/0191975 A1 | 9/2005 | Talwalkar et al. |
| 2005/0191976 A1 | 9/2005 | Shakeshaft et al. |
| 2005/0248401 A1 | 11/2005 | Hellberg et al. |
| 2007/0066224 A1 | 3/2007 | d'Hont et al. |
| 2007/0066250 A1 | 3/2007 | Takahashi et al. |
| 2007/0069818 A1 | 3/2007 | Bhatti et al. |
| 2007/0123184 A1 | 5/2007 | Nesimoglu et al. |
| 2007/0146090 A1 | 6/2007 | Carey et al. |
| 2007/0159257 A1 | 7/2007 | Lee et al. |
| 2007/0247222 A1 | 10/2007 | Sorrells et al. |
| 2007/0247253 A1 | 10/2007 | Carey et al. |
| 2007/0281635 A1 | 12/2007 | McCallister et al. |
| 2007/0290747 A1 | 12/2007 | Traylor et al. |
| 2007/0291718 A1 | 12/2007 | Chan et al. |
| 2008/0001660 A1 | 1/2008 | Rasmussen |
| 2008/0003960 A1 | 1/2008 | Zolfaghari |
| 2008/0003962 A1 | 1/2008 | Ngai |
| 2008/0007333 A1 | 1/2008 | Lee et al. |
| 2008/0012637 A1 | 1/2008 | Aridas et al. |
| 2008/0019459 A1 | 1/2008 | Chen et al. |
| 2008/0085684 A1 | 4/2008 | Phillips et al. |
| 2008/0146171 A1 | 6/2008 | Hellberg et al. |
| 2008/0297246 A1 | 12/2008 | Taylor |
| 2010/0073084 A1 | 3/2010 | Hur et al. |
| 2010/0120384 A1 | 5/2010 | Pennec |
| 2010/0201441 A1 | 8/2010 | Gustavsson |
| 2011/0135035 A1 | 6/2011 | Bose et al. |
| 2011/0156815 A1 | 6/2011 | Kim et al. |
| 2011/0309679 A1 | 12/2011 | Fisher et al. |
| 2012/0176195 A1 | 7/2012 | Dawson et al. |
| 2012/0235736 A1 | 9/2012 | Levesque et al. |
| 2012/0252382 A1 | 10/2012 | Bashir et al. |
| 2012/0256686 A1 | 10/2012 | Royer |
| 2012/0313602 A1 | 12/2012 | Perreault et al. |
| 2012/0326684 A1 | 12/2012 | Perreault et al. |
| 2013/0241625 A1 | 9/2013 | Perreault et al. |
| 2013/0251066 A1 | 9/2013 | Kim et al. |
| 2013/0307618 A1 | 11/2013 | Anvari |
| 2013/0343106 A1 | 12/2013 | Perreault et al. |
| 2013/0343107 A1 | 12/2013 | Perreault |
| 2014/0118063 A1 | 5/2014 | Briffa et al. |
| 2014/0118065 A1 | 5/2014 | Briffa et al. |
| 2014/0120854 A1 | 5/2014 | Briffa et al. |
| 2014/0125412 A1 | 5/2014 | Dawson et al. |
| 2014/0132354 A1 | 5/2014 | Briffa et al. |
| 2014/0167513 A1 | 6/2014 | Chang et al. |
| 2014/0225581 A1 | 8/2014 | Giuliano et al. |
| 2014/0226378 A1 | 8/2014 | Perreault |

FOREIGN PATENT DOCUMENTS

| | | |
|---|---|---|
| EP | 1 609 239 B1 | 7/2010 |
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | WO 2009/153218 A1 | 12/2009 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

Written Opinion of the ISA for PCT/US2013/065552 dated Mar. 20, 2014.
PCT Search Report of the ISA for PCT/US2013/065553 dated Mar. 20, 2014.

(56) References Cited

OTHER PUBLICATIONS

Written Opinion of the ISA for PCT/US2013/065553 dated Mar. 20, 2014.
Notice of Allowance for U.S. Appl. No. 13/663,887 filed on Oct. 30, 2012.
PCT Search Report of the ISA for PCT/US2013/70027 dated Apr. 22, 2014.
PCT Written Opinion of the ISA for PCT/US2013/70027 dated Apr. 22, 2014.
Office Action dated May 23, 2014 for U.S. Appl. No. 13/663,878, filed Oct. 30, 2012.
Briffa, et. al; "Linearization Circuits and Methods for Multilevel Power Amplifier Systems;" Patent Application filed Mar. 15, 2013; U.S. Appl. No. 13/833,050.
Briffa, et al; "Linearization Circuits and Methods for Multilevel Power Amplifier Systems;" Patent Application filed Oct. 28, 2013; U.S. Appl. No. 14/064,572.
U.S. Appl. No. 14/035,445, filed Sep. 24, 2013, Perreault.
U.S. Appl. No. 14/338,671, filed Jul. 23, 2014, Briffa, et al.
Notice of Allowance dated Jul. 14, 2014 for U.S. Appl. No. 13/833,050, filed Mar. 15, 2013.
Office Action dated Oct. 29, 2014 for U.S. Appl. No. 13/663,878, filed Oct. 30, 2012.
Office Action dated Nov. 3, 2014 for U.S. Appl. No. 14/338,671, filed Jul. 23, 2014.
Sungwon Chung, et al., "Asymmetric Multilevel Outphasing Architecture for Multi-Standard Transmitters", 2009 IEEE Radio Frequency Integrated Circuits Symposium, pp. 237-240.
D. Diaz, et al., "Comparison of Two Different Cell Topologies for a Multilevel Power Supply to Achieve High Efficiency Envelope Amplifier", IEEE , 2009, pp. 25-30.
M. Rodriguez, et al., "Multilevel Converter for Envelope Tracking in RF Power Amplifiers", IEEE, 2009, pp. 503-510.
Yuan-Jyue Chen, et al., "Multilevel LINC System Design for Wireless Transmitters", IEEE, 2007, pp. 1-4.
Jinsung Choi, et al., "AΔΣ—Digitized Polar RF Transmitter", IEEE Transactions on Microwave Theory and Techniques, vol. 55, No. 12, Dec. 2007, pp. 2679-2690.
Kai-Yuan Jheng, et. al., "Multilevel LINC System Design for Power Efficiency Enhancement", IEEE, 2007, pp. 31-34.
Kevin Tom, et al., "Load-Pull Analysis of Outphasing Class-E Power Amplifier", The $2^{nd}$ International Conference on Wireless Broadband and Ultra Wideband Communications (AusWireless 2007), IEEE, 2007, pp. 1-4.
Surya Musunuri, et al., "Improvement of Light-Load Efficiency Using Width-Switching Scheme for CMOS Transistors", IEEE Power Electronics Letters, vol. 3, No. 3, Sep. 2005, pp. 105-110.
Frederick H. Raab, et al., "RF and Microwave Power Amplifier and Transmitter Technologies—Part 3", Sep. 2003, High Frequency Electronics, Summit Technical Media, LLC., pp. 34-48.
Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784.
Invitation to Pay Additional Fees in PCT/US2009/063821 dated Feb. 9, 2010.
PCT Search Report of the ISA dated Apr. 13, 2010.
PCT Written Opinion of the ISA dated Apr. 13, 2010.
International Preliminary Report on Patentability of the ISA for PCT/US2009/063821 dated May 26, 2011.
Amendment to Office Action mailed Apr. 7, 2011 (U.S. Appl. No. 12/680,048, filed Mar. 25, 2010).
Response to Rule 161 communication dated Jun. 28, 2011; Jan. 9, 2012.
U.S. Appl. No. 12/615,696, filed Nov. 10, 2009; 427 pages.
U.S. Appl. No. 13/106,915, filed May 12, 2011; Part 1 of 2, 291 pages.
U.S. Appl. No. 13/106,915, filed May 12, 2011; Part 2 of 2, 238 pages.
U.S. Appl. No. 13/423,909, filed Mar. 19, 2012; Part 1 of 3, 300 pages.
U.S. Appl. No. 13/423,909, filed Mar. 19, 2012; Part 2 of 3, 360 pages.
U.S. Appl. No. 13/423,909, filed Mar. 19, 2012; Part 3 of 3, 397 pages.
Beltran, et al.; "HF Outphasing Transmitter Using Class-E Power Amplifiers;" Microwave Symposium Digest, IEEE; Jun. 2009; pp. 757-760.
Bifrane, et al.; "On the Linearity and Efficiency of Outphasing Microwave Amplifiers;" IEEE Transactions on Microwave Theory and Techniques; vol. 52; No. 7; Jul. 2004; pp. 1702-1708.
Chen, et al.; "A High Efficiency Outphasing Transmitter Structure for Wireless Communications;" Digital Signal Processing Workshop, IEEE; Jan. 2009, pp. 348-352.
Chireix; "High Power Outphasing Modulation;" Proceedings of the Institute of Radio Engineers; vol. 23; No. 11; Nov. 1935; pp. 1370-1392.
Cox; "Linear Amplification with Nonlinear Components;" IEEE Transactions on Communications; Dec. 1974; pp. 1942-1945.
El-Hamamsy; "Design of High-Efficiency RF Class-D Power Amplifier;" IEEE Transactions on Power Electronics; vol. 9; No. 3; May 1994; pp. 297-308.
Eun, et al.; "A High Linearity Chireix Outphasing Power Amplifier Using Composite Right/Left-Handed Transmission Lines;" Proceedings of the $37^{th}$ European Microwave Conference; Oct. 2007; pp. 1622-1625.
Everitt, et al.; *Communication Engineering*;" $3^{rd}$ Edition, Chapter 11, pp. 403-450, New York: McGraw-Hill, 1956.
Gerhard, et al.; "Improved Design of Outphasing Power Amplifier Combiners;" 2009 German Microwave Conference; Mar. 2009; pp. 1-4.
Godoy, et al.; "Outphasing Energy Recovery Amplifier With Resistance Compression for Improved Efficiency;" IEEE Transactions on Microwave Theory and Techniques; vol. 57; No. 12; Dec. 2009; pp. 2895-2906.
Hakala, et al., "A 2.14-GHz Chireix Outphasing Transmitter;" IEEE Transactions on Microwave Theory and Techniques; vol. 53; No. 6; Jun. 2005; pp. 2129-2138.
Hakala, et al.; Chireix Power Combining with Saturated Class-B Power Amplifiers; $12^{th}$ GAAS Symposium; Oct. 2004, pp. 379-382.
Hamill; "Impedance Plan Analysis of Class DE Amplifier;" Electronics Letters; vol. 30; No. 23; Nov. 10, 1994; pp. 1905-1906.
Hamill; "Time Reversal Duality Between Linear Networks;" IEEE Transactions on Circuits and Systems-I: Fundamental Theory and Applications; vol. 43; No. 1; Jan. 1996; pp. 63-65.
Hamill; "Time Reversal Duality in Dc-Dc Converters;" Power Electronics Specialists Conference, IEEE; vol. 1; Jun. 1997; 7 pages.
Han, et al.; "Analysis and Design of High Efficiency Matching Networks;" IEEE Transactions on Power Electronics; vol. 21; No. 5, Sep. 2006; pp. 1484-1491.
Han, et al.; "Resistance Compression Networks for Radio-Frequency Power Conversion;" IEEE Transactions on Power Electronics; vol. 22; No. 1; Jan. 2007; pp. 41-53.
Honjo; "A Simple Circuit Synthesis Method for Microwave Class-F Ultra-High-Efficiency Amplifiers with Reactance-Compensation Circuits;" Solid-State Electronics 44; Feb. 2000; pp. 1477-1482.
Hur, et al.; "A Multi-Level and Multi-Band Class-D CMOS Power Amnplifier for the LINC System in the Cognitive Radio Applicaton;" IEEE Microwave and Wireless Components Letters; vol. 20; Issue 6; Jun. 2010; pp. 1-3.
Hur, et al.; "Highly Efficient and Linear Level Shifting Digital LINC Transmitter with a Phase Offset Cancellation;" Radio & Wireless Symposium; Jan. 2009; pp. 211-214.
Hur, et al.; "Highly Efficient Uneven Multi-Level LINC Transmitter;" Electronics Letters; Jul. 30, 2009; vol. 45; No. 16; 2 pages.
Kee, et al.; "The Class-E/F Family of ZVS Switching Amplifiers;" IEEE Transactions on Microwave Theory and Techniques; vol. 51; No. 6; Jun. 2003; pp. 1677-1690.
Kruass, et al.; *Solid State Radio Engineering*; Chapter 14, New York: Wiley, 1980.
Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; pp. 1467-1470.

(56) References Cited

OTHER PUBLICATIONS

Lee; "Planar Microwave Engineering;" Chapter 20, pp. 630-687, New York: Cambridge University Press, 2004.
Lepine, et al.; "L-Band LDMOS Power Amplifiers Based on an Inverse Class-F Architecture;" IEEE Transactions on Microwave Theory and Techniques; vol. 53; No. 6; Jun. 2005; pp. 2007-2012.
Ni, et al.; "A New Impedance Match Method in Serial Chireix Combiner;" 2008 Asia-Pacific Microwave Conference; Dec. 2008; pp. 1-4.
Perreault; A New Power Combining and Outphasing Modulation System for High-Efficiency Power Amplification; Circuits and Systems (MWSCAS), 53$^{rd}$ IEEE, International Midwest Symposium; Aug. 2010; pp. 1-14.
Phinney, et al; "Radio-Frequency Inverters with Transmission-Line Input Networks;" IEEE Transactions on Power Electronics; vol. 22; No. 4; Jul. 2007; pp. 1154-1161.
Qureshi, et al.; "A 90-W Peak Power GaN Outphasing Amplifier with Optimum Input Signal Conditioning;" IEEE Transactions on Microwave Theory and Techniques; vol. 57; No. 8; Aug. 2009; pp. 1925-1935.
Raab; "Class-F Power Amplifiers with Maximally Flat Waveforms;" IEEE Transactions on Microwave Theory and Techniques; vol. 45; No. 11; Nov. 1997; pp. 2007-2012.
Raab; "Efficiency of Outphasing RF Power-Amplifier Systems;" IEEE Transactions on Communications; vol. Com-33; No. 10; Oct. 1985; pp. 1094-1099.
Raab, et al.; "RF and Microwave Power Amplifier and Transmitter Technologies—Part 3;" High Frequency Electronics; Sep. 2003; pp. 34-48.
Rivas, et al.; "A High-Frequency Resonant Inverter Topology with Low-Voltage Stress;" IEEE Transactions on Power Electronics; vol. 23; No. 4; Jul. 2008; pp. 1759-1771.
Sokal, et al.; "Class E-A New Class of High-Efficiency Tuned Single-Ended Switching Power Amplifiers;" IEEE Journal of Solid-State Circuits; vol. SC-10; No. 3; Jun. 1975; pp. 168-176.
Sokal; "Class-E RF Power Amplifiers;" QEX; Jan./Feb. 2001; pp. 9-20.
Yao, et al.; "Power Amplifier Selection for LINC Applications;" IEEE Transactions on Circuits and Systems-II; Express Briefs; vol. 53; No. 8; Aug. 2006; pp. 763-767.
Zhang, et al.; "Analysis of Power Recycling Tecniques for RF and Microwave Outphasing Power Amplifiers;" IEEE Transactions on Circuits and Systems-II: Analog and Digital Signal Processing; vol. 49; No. 5; May 2002; pp. 312-320.
Zhou, et al.; "A Distributed Active Transformer Coupled Outphasing Power Combiner;" IEEE Microwave Conference; Dec. 2009; pp. 2565-2568.
Zhukov, et al.; "Push-pull switching oscillator without commutating losses;" Poluprovodnikovye Pribory v. Tekhnike Elektrosvyazi, No. 15, Jan. 1975, 8 pages.
Xu, et al.; "A 28.1dBm class-D outphasing power amplifier in 45nm LP digital CMOS;" Symposium on VLSI Circuits Digest of Technical Papers; Jun. 16, 2009; pp. 206-207.
Zhou, et al.; "A Distributed Active Transformer Coupled Outphasing Power Combiner;" Microwave Conference, IEEE; Dec. 7, 2009; pp. 2565-2568.
PCT Search Report of the ISA for PCT/US2011/023613 dated May 30, 2011.
Written Opinion of the ISA for PCT/US2011/023613 dated May 30, 2011.
International Preliminary Report on Patentability of the ISA for PCT/US2011/023613 dated Aug. 16, 2012.
U.S. Appl. No. 13/020,568, filed Feb. 3, 2011; part 1 of 2, 335 pages.
U.S. Appl. No. 13/020,568, filed Feb. 3, 2011; part 2 of 3, 100 pages.
U.S. Appl. No. 13/020,568, filed Feb. 3, 2011; part 3 of 3, 224 pages.
Application of Mark A. Briffa, et al. U.S. Appl. No. 13/663,887, filed Oct. 30, 2012; 72 pages.
Cripps; "RF Power Amplifier for Wireless Communications, 2$^{nd}$ Ed.;" Chapter 14, Artech House, Boston, MA; Jan. 2006.
Godoy, et al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384.
Raab; "Average Efficiency of Class-G Power Amplifiers;" IEEE Transactions on Consumer Electronics; vol. CE-32; No. 2; May 1986; pp. 145-150.
Shirvani, et al.; "A CMOS RF Power Amplifier With Parallel Amplification for Efficient Power Control;" IEEE Journal of Solid-State Circuits; vol. 37; No. 6; Jun. 2002; pp. 684-693.
Vasic, et al.; "Multilevel Power Supply for High Efficiency RF Amplifiers;" 2009 IEEE Applied Power Electronics Conference; pp. 1233-1238; Feb. 2009.
Walling, et al.; "A Class-G Supply Modulator and Class-E PA in 130 nm CMOS;" IEEE Journal of Solid-State Circuits; vol. 44; No. 9; Sep. 2009; pp. 2339-2347.
Yan, et al.; "A High Efficiency 780 MHz GaN Envelope Tracking Power Amplifier;" 2012 Compound Semiconductor Integrated Circuits Syumposium; Oct. 2012; pp. 1-4.
Yousefzadeh, et al; "Three-Level Buck Converter for Envelope Tracking Applications;" IEEE Transactions on Power Electronics; vol. 21, No. 2; Mar. 2006; pp. 549-552.
Briffa, et al.; "Transmitter Architecture and Related Methods;" Patent filed Oct. 30, 2012; U.S. Appl. No. 13/663,878.
Van der Heijden, et al.; "A 19W High-Efficiency Wide-Band CMOS-GaN Class-E Chireix RF Outphasing Power Amplifier;" Microwave Symposium Digest (MMT), 2011 IEEE MTT-S International; Jun. 5-10, 2011; 4 pages.
Response to Office Action dated May 23, 2014 for U.S. Appl. No. 13/663,878, filed Oct. 30, 2012.
Response filed Dec. 30, 2014 of Office Action dated Oct. 29, 2014 for U.S. Appl. No. 13/663,878, 20 pages.
Response filed on Mar. 10, 2015; to an Office Action dated Feb. 23, 2015; U.S. Appl. No. 14/064,572; 3 pages.
Office Action dated May 21, 2015; for U.S. Appl. No. 14/666,965; 15 pages.
Office Action dated Jun. 2, 2015; for U.S. Appl. No. 13/663,878; 18 pages.
Office Action dated Feb. 23, 2015; for U.S. Appl. No. 14/064,572, filed Oct. 28, 2013; 29 pages.
Notice of Allowance dated Mar. 2, 2015 for U.S. Appl. No. 14/338,671, filed Jul. 23, 2014; 11 pages.
U.S. Appl. No. 14/619,737, filed Feb. 11, 2015, Perreault, et al.
U.S. Appl. No. 14/666,965, filed Mar. 24, 2015, Briffa, et al.
Office Action dated Apr. 24, 2015; for U.S. Appl. No. 14/064,572 10 pages.
Office Action dated May 7, 2015 for U.S. Appl. No. 13/663,878, filed Oct. 30, 2012.
PCT International Preliminary Report on Patentability for Appl. No. PCT/US2013/06552 dated May 14, 2015.
PCT International Preliminary Report on Patentability for Appl. No. PCT/US2013/06553 dated May 14, 2015.
Response to Office Action dated Nov. 3, 2014 as filed on Jan. 22, 2015 for U.S. Appl. No. 14/338,671, filed Jul. 23, 2014.
U.S. Appl. No. 14/758,033, filed Jun. 26, 2015, Perreault, et al.
U.S. Appl. No. 14/791,685, filed Jul. 6, 2015, Perreault, et al.
PCT International Preliminary Report on Patentability and Written Opinion of the ISA dated Jun. 2, 2015; for PCT Pat. App. No. PCT/US2013/070027; 12 pages.
Response filed on Jul. 24, 2015 to a Non-Final Office Action dated May 21, 2015, for U.S. Appl. No. 14/666,965; 12 pages.
Response filed on Jul. 21, 2015 to a Final Office Action dated Jun. 2, 2015, for U.S. Appl. No. 13/663,878; 13 pages.
Response filed on Jul. 17, 2015 to a Non-Final Office Action dated Apr. 24, 2015, for U.S. Appl. No. 14/064,572; 9 pages.

\* cited by examiner

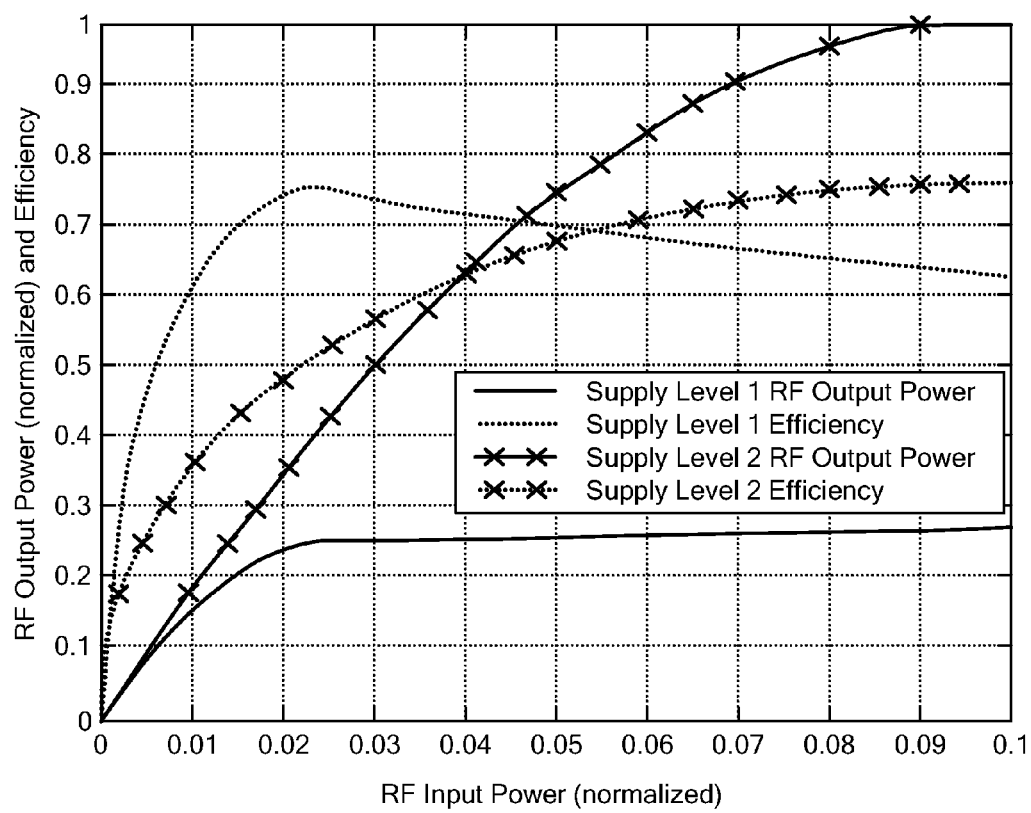
FIG. 2
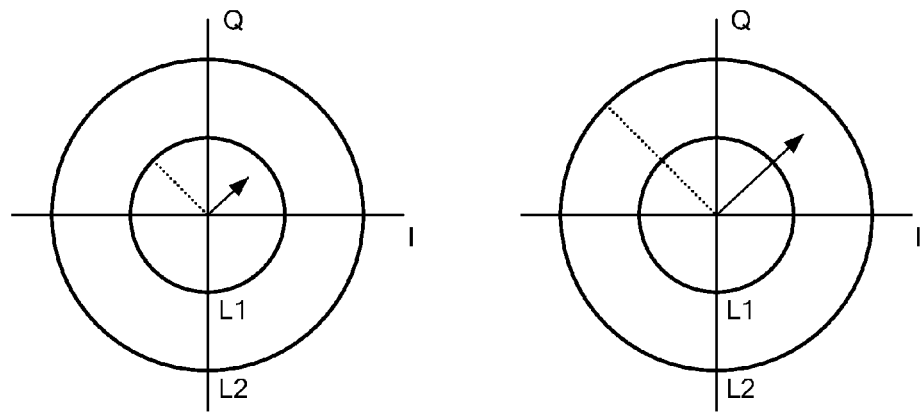
FIG. 3  FIG. 3A

METHOD AND APPARATUS FOR MULTILEVEL POWER AMPLIFICATION

CROSS REFERENCE TO RELATED APPLICATIONS

This application is a continuation of U.S. application Ser. No. 13/833,050, filed Mar. 15, 2013, which is a continuation-in-part of U.S. application Ser. Nos. 13/663,878 and 13/663,887, both filed on Oct. 30, 2012, and which also claims the benefit of Application No. 61/730,214, filed on Nov. 27, 2012, ail of which are incorporated by reference herein in their entireties.

STATEMENT REGARDING FEDERALLY SPONSORED RESEARCH

Not applicable.

FIELD

Subject matter disclosed herein relates generally to radio frequency (RF) systems and, more particularly, to circuits and techniques for multilevel power amplifier systems.

BACKGROUND

As is known in the art, achieving both high efficiency and high linearity in radio frequency (RF) power amplifier systems is a longstanding challenge. One means of improving efficiency in such systems is an architecture wherein the power amplifier system is switched with discrete transitions among a set of operating states. For example, this includes an RF amplifier system in which the drain bias voltage for the one or more power amplifiers provided as part of the RF power amplifier system is dynamically selected from more than one possible source or level (e.g., selected from among multiple discrete supply voltages.)

A range of power amplifier systems exist in which the drain bias for one or more power amplifiers forming the power amplifier system is provided via dynamic selection from among a plurality of sources. For example, some systems dynamically select drain bias voltages from among a discrete set of input supply voltages and then provide additional regulation to provide a continuously-varying drain voltage (e.g., for partially realizing a desired envelope in the output). Other prior art systems directly exploit discrete drain levels, including "class G" amplifiers, multi-level LINC (MLINC) Power Amplifiers, Asymmetric Multilevel Outphasing (AMO) Power Amplifiers, and Multilevel Rackoff amplifiers.

SUMMARY

Alternatively, and in accordance with one aspect of the concepts systems and techniques described herein, it has been recognized that one can provide a power amplifier system that switches among a set of discrete levels for some operating conditions, and switches the drain bias to an input that provides continuous envelope tracking for other conditions. Such conditions might include when operating at very low bandwidths or power levels, such that the efficiency penalty of continuous envelope tracking is not as severe.

Also described are concepts, circuits, systems and methods for achieving high linearity, high efficiency power amplifiers, including digital predistortion (DPD) and pulse cancellation in switched-state RF power amplifier systems. This includes concepts, circuits, systems and methods for providing improved linearity in power amplifier systems in which component power amplifier(s) are switched among a set of operating states. This includes, for example, RF amplifier systems having one or more power amplifiers and in which the drain bias voltage for at least one of the one or more power amplifiers (PAs) in the RF amplifier system is dynamically selected from more than one possible source or level (e.g., switched between multiple discrete supply voltages.)

Because the characteristics of a switched-state power amplifier vary in practice with the selected state (e.g., with the selected drain voltage supply), also described herein is a system in which the signal predistortion used to enhance linearity is indexed in part by the selected state of the system. Such State Based (or Supply-Based) Digital Pre-Distortion (SB-DPD) enables smooth (high-linearity) output to be maintained from a switched-state power amplifier system as the operation of the system is switched among different states.

Moreover, when a switched state power amplifier system is changed among different discrete states, undesired components may be injected into the PA output during and around the transition (e.g., because the PA drain bias acts as an additional input that causes transients in the output when the drain bias varies owing to supply switching). Also addressed is the problem of state changes introducing unwanted components in the output spectrum by introducing a "pulse cancellation" technique, wherein the effects of the disturbance (e.g., at the drain input of the PA) on the RF output are compensated (or "cancelled") at the PA output by a cancellation signal introduced via the RF drive input of the transitioning PA or a different PA.

Also described herein are concepts directed towards a means for achieving high linearity in RF power amplifier systems, thereby yielding RF power amplifier systems having both high efficiency and high linearity.

In accordance with one aspect of the concepts, systems, circuits, and techniques described herein, a radio frequency (RF) system having an input and an RF output comprises: one or more RF amplifiers each having an RF input, an RF output, and a power supply input; and a voltage control unit coupled to provide a power supply voltage to the power supply input of at least one of the one or more RF amplifiers, wherein the voltage control unit is configured to dynamically select the power supply voltage from among 3 or more discrete voltage levels based at least in part upon one or more signal characteristics of a signal to be amplified.

In one embodiment, the one or more RF amplifiers are provided as one or more RF power amplifiers.

In one embodiment, the voltage control unit dynamically selects the power supply voltage from among 4 or more discrete voltage levels based at least in part upon one or more signal characteristics of the signal to be amplified.

In one embodiment, the power supply voltage provided to the power supply input of the at least one RF amplifier by the voltage control unit is selected from among the 3 or more discrete voltage levels for a first set of operating conditions and is derived from an input that provides continuous envelope tracking for other operating conditions not included in the first set.

In one embodiment, disturbances in the RF output of the system owing to changes in the selected power supply voltage level of at least one of the one or more RF amplifiers are compensated for by as signal applied via the RF input of at least one of the one or more RF amplifiers.

In one embodiment, the system has first and second power amplifiers, and wherein disturbances in the RF output of the system owing to changes in the power supply input selection of the first power amplifier are compensated by a signal introduced via the RF input of the second power amplifier.

In one embodiment, the compensation signal is introduced as an additive component in a baseband signal.

In one embodiment, the compensation signal is introduced as a multiplicative factor applied to digital data in a baseband signal.

In one embodiment, the RF system further comprises a linearization unit coupled to each of the RF amplifiers associated with the voltage control unit, the linearization unit to improve the linearity of the system by predistorting the RF input to at least one of the one or more RF amplifiers, wherein the predistortion is indexed, at least in part, to the selected power supply voltage level.

In accordance with another aspect of the concepts, systems, circuits, and techniques described herein, a radio frequency (RF) power amplifier system having an input and an RF output comprises one or more power amplifiers each having an RF input, an RF output, and a power supply input, wherein a power supply voltage provided to the power supply input of at least one of the one or more power amplifiers is dynamically selected from among 3 or more different voltage levels based at least in part upon one or more signal characteristics of a signal to be amplified.

In one embodiment, the power supply voltage provided to the power supply input of the at least one power amplifier is dynamically selected from among 4 or more different voltage levels based at least in part upon one or more signal characteristics of the signal to be amplified.

In one embodiment, variations in an RF output signal at the RF output of the power amplifier system owing to changes in selection of a power supply input of at least one of the one or more power amplifiers are compensated by a compensation signal provided to the RF input of at least one of the one or more power amplifiers.

In accordance with still another aspect of the concepts, systems, circuits, and techniques described herein, a radio frequency (RF) power amplifier system having a data input and an RF output, comprises one or more power amplifiers that are switched among a discrete set of 3 or more operating states based at least in part upon data provided to the data input of the power amplifier system.

In one embodiment, the discrete set of 3 or more operating states is determined at least in part by the selection of at least one drain bias voltage for at least one of the one or more power amplifiers, wherein the at least one drain bias voltage is selected from among multiple sources or levels.

In one embodiment, the one or more power amplifiers includes multiple power amplifiers, each of the multiple power amplifiers having one or more operating states; and the set of operating states for each of the multiple power amplifiers is determined at least in part by the number of power amplifiers selected to provide power amplification.

In one embodiment, the power amplifier system further comprises a pulse cancellation system, coupled to at least one of the one or more power amplifiers, to at least partially cancel variations in an RF output signal at the RF output of the power amplifier system caused by switching among the discrete set of operating states by introducing a cancellation signal at the RF input of at least one of the one or more power amplifiers.

In one embodiment, the power amplifier system further comprises a coupler to couple at least a portion of the RF output signal of the power amplifier system to the pulse cancellation system, wherein the pulse cancellation system is configured to generate one or more cancellation signals based, at least in part, from the coupled signal.

In one embodiment, the one or more power amplifiers are switched among a discrete set of 4 or more operating states based at least in part upon data provided to the data input of the power amplifier system.

In accordance with a further aspect of the concepts, systems, circuits, and techniques described herein, a method includes digital predistortion (DPD) and pulse cancellation in switched-state RF power amplifier systems to provide high linearity, high efficiency power amplifiers.

In accordance with a further aspect of the concepts, systems, circuits, and techniques described herein, a circuit for providing improved linearity in power amplifier systems in which component power amplifier(s) are switched among a set of operating states includes an RF amplifier system Ira which a drain bias voltage for the one or more constituent power amplifiers comprising the RF amplifier system is dynamically selected from more than one possible source or level.

In accordance with a still further aspect of the concepts, systems, circuits, and techniques described herein, a system in which signal predistortion used to enhance linearity is indexed, at least in part, by a selected state of the system.

In accordance with a still further aspect of the concepts, systems, circuits, and techniques described herein, a state-based (or supply-based) digital pre-distortion (SB-DPD) system which enables smooth (high-linearity) output to be maintained from a switched-state power amplifier system as the operation of the system is switched among different states.

In accordance with a further aspect of the concepts, systems, circuits, and techniques described herein, a system comprising means for providing pulse cancellation to cancel undesired signal components injected into an output of a switched state power amplifier system as a result of the switched state power amplifier system changing among different discrete states.

In accordance with a further aspect of the concepts, systems, circuits, and techniques described herein, a system includes cancellation means responsive to one or more unwanted signal components in an output spectrum of RF power amplifier (PA) system. In one embodiment, the unwanted signal components are a result of state changes in the RF PA system and the cancellation means provides at least one of: (a) a cancellation signal at an RF drive input of a power amplifier giving rise the one or more unwanted signal components in the RF PA system such that the effects of the disturbance on the RF PA system output are compensated at an output of the power amplifier by the cancellation signal; or (b) a cancellation signal at an RF drive input of a power amplifier not directly giving rise the one or more unwanted signal components in the RF PA system such that the effects of the disturbance on the RF PA system output are compensated at an output of the power amplifier by the cancellation signal.

With this particular arrangement, a system and related techniques for achieving a high degree of linearity in switched-state power amplifier systems is provided.

BRIEF DESCRIPTION OF THE DRAWINGS

The foregoing features may be more fully understood from the following description of the drawings in which:

FIG. 2 is a plot of RF output power and efficiency vs. RF input power for two different direct current (DC) supply levels: a first level (level 1) and a second level (level 2);

FIGS. 3 and 3A are IQ diagrams showing the range of output RF output amplitudes (phasor lengths) achievable with two different DC supply levels: a lower level (L1) and a higher level (L2);

DETAILED DESCRIPTION

Figure 1:
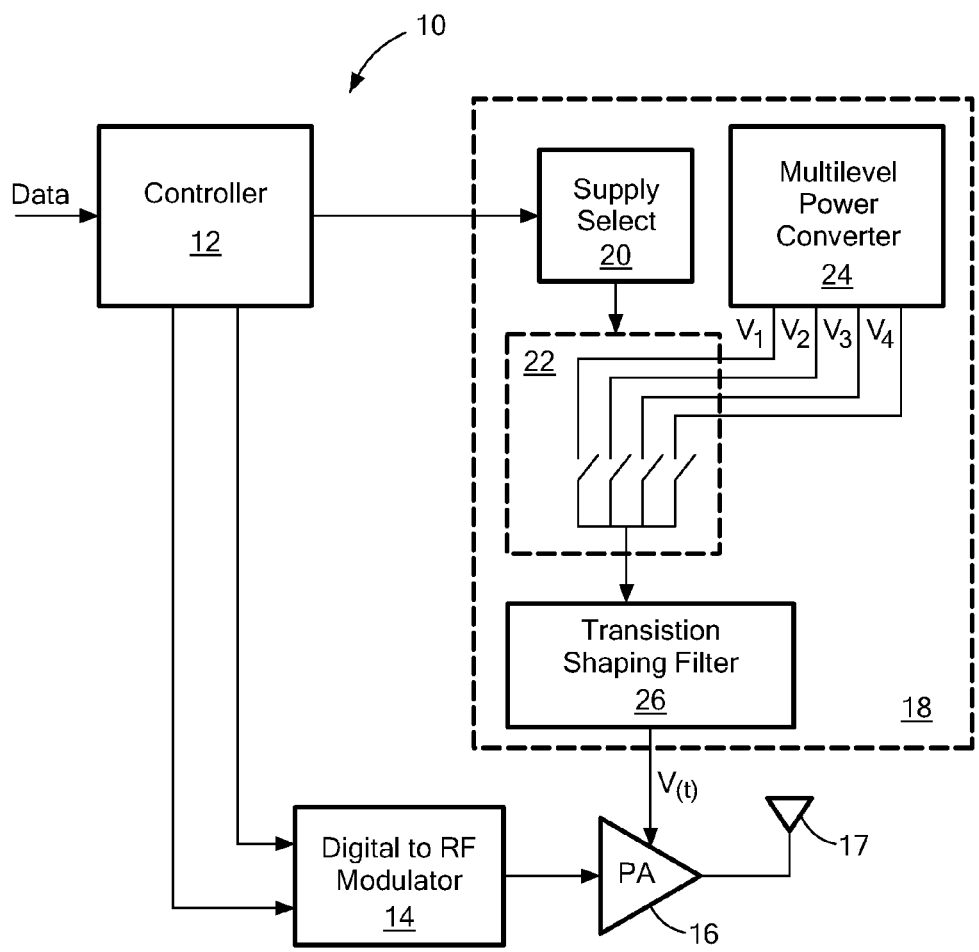
FIG. 1 is a block diagram of a radio frequency (RF) circuit in which a power supply bias signal coupled to a power amplifier (PA) is dynamically selected from multiple inputs depending upon one or more characteristics of the signal to be transmitted.

Referring now to FIG. 1, an exemplary system 10 in which there is dynamic switching of a drain bias. System 10 may correspond, for example, to an exemplary RF transmitter 10 having an input source 24 (e.g. a power supply) providing multiple levels that can be coupled to a power supply input of a radio frequency (RF) amplifier, which in this exemplary embodiment is provided as an RF power amplifier (PA).

As shown, RF system 10 includes a controller 12 having an input configured to accept data provided thereto and one or more outputs coupled to a digital to RF modulator 14. An output of digital to RF modulator 14 is coupled to an input of an RF amplifier 16, here shown as an RF power amplifier 16, and an output of RF amplifier 16 is coupled to inputs of one or more antennas 17 to facilitate the transmission of RF transmit signals to remote wireless entities (not illustrated in FIG. 1).

Controller 12 also has an output coupled to a voltage control unit 18. Voltage control unit 18 may provide a variable supply voltage V(t) to a bias terminal of RF amplifier 16. The signal characteristics of the variable supply voltage V(t) are based, at least in part, upon a value or characteristic of a control signal provided by controller 12. In one exemplary embodiment, digital to RF modulator 14 provides an RF input signal to power amplifier 16 based upon input information (e.g., $I_1$, $Q_1$) received from controller 12. Controller 12 may use any of the control techniques described herein. In some implementations, controller 12 may use voltage control of voltage control unit 18 and the amplitude and phase information delivered to digital to RF modulator 14 to ensure that the transmit data is accurately represented within the RF output signal of RF transmitter 10. Controller 12 may use amplitude information delivered to digital to RF modulator 14 to control/adjust an output power level of RF transmitter 10 (e.g., a transmit power level). In some implementations, this output power control capability may be used to provide power backoff for RF transmitter 10.

In the voltage control unit 18, voltage control unit 18 includes a supply select module 20 having an input coupled to controller 12 and an output coupled to a switch circuit 22 comprising a plurality of switches. Exemplary voltage control unit 18 further includes a multilevel power converter 24 which provides a plurality of voltage levels. In the exemplary embodiment of FIG. 1, multilevel power converter 24 provides four voltage levels $V_1$-$V_4$, and switch circuit 22 comprises a like number of switches (i.e. four switches). In general, however, switch circuit 22 comprises a switch fabric which allows any desired combination of voltages available via multilevel power converter 24 to be provided at an output of switch circuit 22.

Exemplary voltage control unit 18 further includes a transition shaping filter 26 coupled between switch circuit output 22 and a bias terminal of RF amplifier 16.

In the exemplary system of FIG. 1, the power supply input to the PA is dynamically switched among different inputs based in part upon the signal to be transmitted. The power supply inputs (e.g., V1, V2, V3, V4) may correspond to fixed analog or digital voltages, or may be themselves dynamically varied based upon one or more of a desired average power level or the signal to be transmitted. The switched power supply levels may be directly applied to the PA or may be filtered to provide acceptable transitions among the power supply levels.

The system of FIG. 1 has some characteristics that can result in nonlinearity in synthesizing the output and can introduce undesired signals into the output, beyond what occurs in some conventional power amplifier (PA) implementations. This can lead to reductions in figures-of-merit such as Adjacent Channel Power Ratio (ACPR) and Error Vector Magnitude (EVM).

The exemplary system of FIG. 1 has the PA drain bias dynamically selected from different power supply sources as the input signal (or data) varies. The drain bias can act as a "second input" into the PA, such that changes in drain bias are directly reflected in the output of the PA. In one aspect, this means that the complex gain and distortion with which the PA synthesizes an output based on input data changes as the power supply input is dynamically changed. This effect can be minimized by making the power amplifier gain as insensitive to drain bias as possible. However, there is a limit to how well this can be done, and gain will still depend upon the drain bias when the power amplifier is in deep compression. Moreover, in many cases, there is not a 1:1 mapping between the instantaneous data input and the supply level that is utilized (e.g., as occurs with power supply selection based on a window of data), making linearization more challenging.

As described in detail below, however, this challenge is addressed by introducing a DPD architecture that produces corrections that are at least in part indexed by the power supply input selection (or, more generally, the selection of states among a set of operating states) and/or the power supply voltage.

A second source of undesired components introduced into the PA system output is the power supply input switching among different levels. The PA drain bias supply acts as a second input (in addition to the PA RF input), such that when the PA drain bias voltage switches (e.g., among different discrete levels), a disturbance "pulse" is introduced into the RF output of the PA system. This can be partly addressed by control of the transitions among different supply levels (e.g., through transition filtering or other means.) Nevertheless, given that supply transitions can happen at a high rate, this can introduce significant energy into the output that does not represent the desired signal. The disturbances can appear as an increase in apparent "broadband noise" in the output spectrum of the power amplifier system. More generally, a temporary disturbance or pulse or other change (collectively variation) in the output may occur when the system is switching among discrete operating modes or among states.)

As described in detail below, however, this challenge is addressed by introducing a "pulse cancellation" technique, wherein the effects of the disturbance (e.g., at the drain input of the PA) are compensated (or "cancelled") by signals introduced via the RF input of the A. This may be done as a time- and level-dependent multiplicative correction factor applied to the digital data (corresponding to a complex multiplicative correction during the transition) and/or as a time and level-dependent additive correction applied to the digital data (corresponding to a complex pulse added to the digital data). It is noted that while the exemplary embodiments described herein at times focus on digital data, such examples are intended to promote clarity in the description of the figures and the broad concepts disclosed herein and it is recognized that the approach concepts and techniques described herein can be similarly applied to RF waveforms.

The above-described correction and cancellation measures can be implemented either individually or in combination and when implemented in combination the above measures can provide much greater fidelity of the output in systems of the architectures considered here.

Referring now to FIG. 2 and considering the case of a system having two supply levels with level 1 corresponding to a first or lower direct current (DC) supply, and level 2 corresponding to a second or higher DC supply. FIG. 2 thus Illustrates the efficiency and (normalized) output power as a function of normalized RF drive power at two different DC power supply levels. It can be seen that for the level 2 DC supply, at a certain RF input power (0.1 normalized) the output power reaches a maximum saturated output power (1 normalized). The output power can be reduced to any value below this saturated maximum (i.e., "backing off" the output power) by reducing the RF input power (or, equivalently, the RF drive amplitude provided to the RF input of the PA). For low levels of RF input and output power, there is a nearly linear (proportional) relation between RF input power and RF output power. However, efficiency in this region is relatively low (e.g., below 40% for RF output powers below 0.25 normalized). The highest efficiency is found in regions of output power at or somewhat below the level at which output power saturates (e.g., efficiency above 70% for output power above 0.83 normalized). Increasing RF input power beyond the level that saturates the power amplifier, however, actually reduces efficiency. This occurs because total input power—DC plus RF—increases but output power does not increase (and in some cases can decrease with further increase in RF input power).

Consider now the power and efficiency for the lower voltage DC supply (level 1). In this case, the maximum saturated output power is much lower than for the higher-voltage (level 2) DC supply (e.g., reaching a maximum output power of only 0.25 normalized). The output power can again be adjusted between zero and this lower maximum value by adjusting RF input power (e.g., backing off the output power by reducing the normalized input power to values below that which saturates the power amplifier), but higher output powers (above 0.25 normalized) are not obtainable at this supply level. It should be noted that for values of output power that can be reached at this lower supply level, higher efficiency is achieved using the lower DC supply level 1 than for the higher DC supply level 2, because the power amplifier is operated closer to its saturated value. Thus, for low values of output power, it is generally desirable to use a lower supply voltage value, so long as the desired output power is achievable and the desired level of linearity and controllability of the power amplifier is achievable.

The variation in efficiency with a given DC voltage supply level is a motivation for power amplifier systems such as "Class G", that switch the power amplifier DC supply among different levels depending on the desired RF output power level. Selecting from multiple DC supply values such that the power amplifier operates at as high an efficiency as possible while being able to provide the desired RF output power can yield significant improvements in efficiency over that achieved with a single supply level.

Referring now to FIGS. 3 and 3A, IQ plots are used to illustrate the achievable SF outputs in terms of the output RF amplitude (phasor length, or SF voltage amplitude) with two different supply levels. For a given supply level, there is an RF output amplitude (proportional to the square root of SF output power) that may be specified as a maximum for that supply level. This maximum amplitude may be that corresponding to the absolute maximum saturated output power (under complete compression) for that supply level, as illustrated in FIG. 2, or may be a level somewhat below this. One may limit the maximum amplitude and power to somewhat slightly lower than those for complete saturation to simplify predistortion of drive signals (for linearization), to account for part-to-part variations in absolute maximum power, to place the specified maximum level in a desirable location on the efficiency vs. output characteristic, or for other reasons. As illustrated in FIG. 3, with the higher supply level, any RF output voltage vector having an amplitude less than or equal to the radius of the circle labeled L2 can be synthesized. With the lower supply level, one can synthesize any RF output voltage vector having an amplitude less than or equal to the radius of the circle labeled L1.

Figure 4:
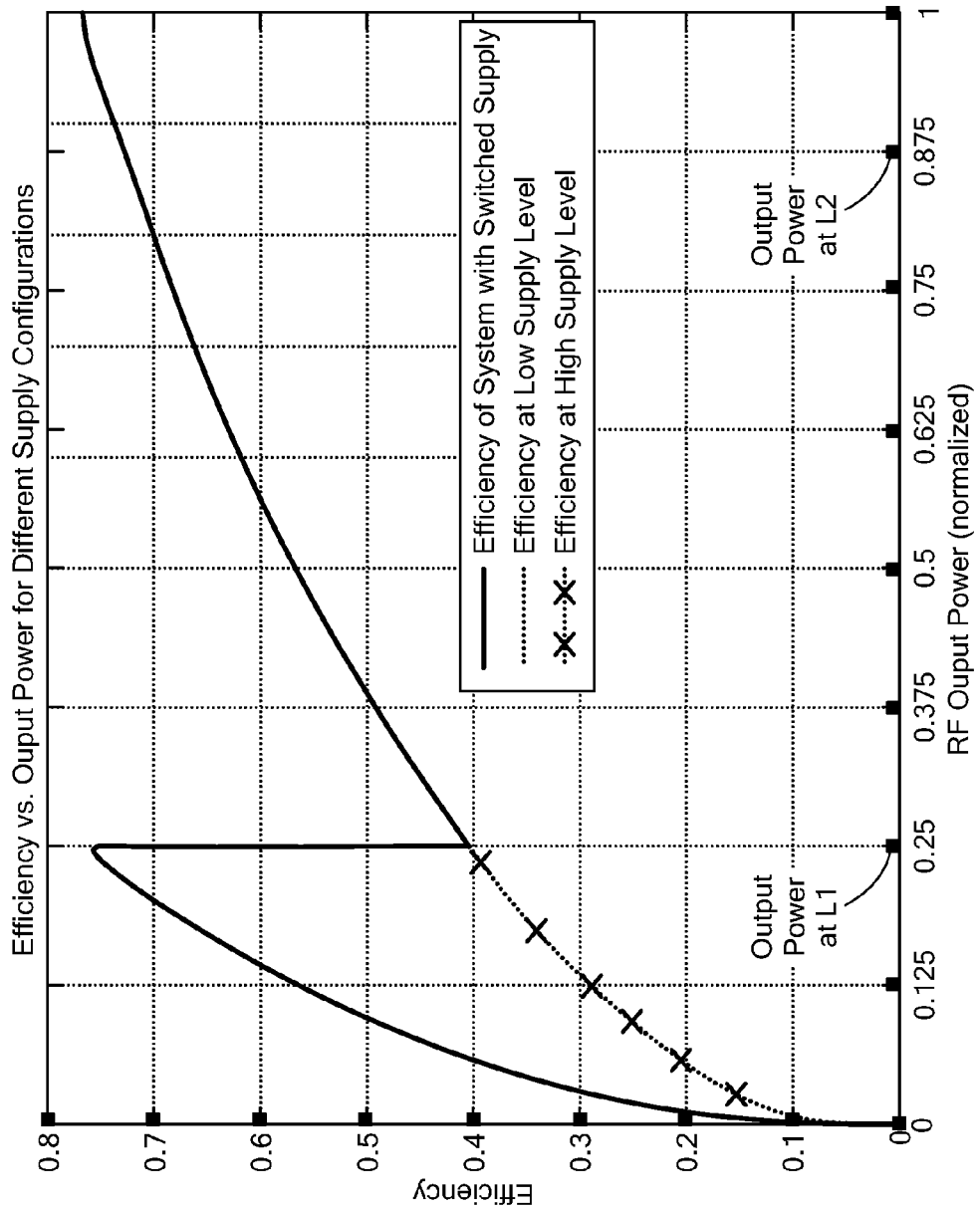
FIG. 4 is a plot of Efficiency vs. RF output power for different PA power supply configurations, including for dynamically switching among two power supply levels based upon desired RF output amplitude.

Referring now to FIG. 4, to exploit the availability of multiple supply voltages to achieve increased efficiency, one may dynamically switch between the two supply levels. Switching among two (or more than two) levels offers a level of efficiency over a wide output power range that is greater (higher) than a level of efficiency which can be achieved with a single supply level. One approach for gaining such efficiency is to switch supply levels based upon the amplitude of the RF output vector being synthesized at any given time, such that the higher supply level is utilized whenever the desired output amplitude is between L1 and L2, and the lower supply level whenever the desired output amplitude is at or below L1. Doing so leads to the efficiency vs. normalized output power characteristic shown in FIG. 4. It should be noted that the efficiency curve for the low supply level is the same as the efficiency curve for the switched supply system over its operating range of 0-0.25 in RF output power. The efficiency curve for the high supply level is the same as the efficiency curve for the switched supply system over the range 0.25-1 in RF output power Alternatively, it is possible to examine or characterize the signal to be synthesized over a longer interval (e.g., a window of multiple digital samples) and manage switching between levels based upon a moving window of data related to one or more signal characteristics. It should be appreciated that the switching need not necessarily depend directly upon one or more signal characteristics, rather the switching may be based upon information derived or otherwise related to one or more signal characteristics. Switching may be selected to depend on considerations such as minimum and maximum values of a signal during a window, the minimum duration that a signal sits at a given level, the estimated energy costs or linearity impact of making a transition, and other considerations. For example, if a current given supply level can support the output for an entire window, and a lower supply level can support the output for a fractional portion of the window but not the whole window, the decision to move to said lower supply level for the duration in which the lower supply is useable may depend on the duration with which the lower supply level can be used. Examples are provided in the above-referenced application Ser. No. 13/663,887 which application is hereby incorporated herein by reference.

This process could be performed, for example, in a way that ensures that the desired instantaneous output amplitude can always be synthesized, but switch down to the lower supply level only if the desired output signal amplitude will remain at a level at or below L1 for a minimum duration. Amplitude hysteresis, minimum dwell times or other constraints can likewise be put into level switching decisions. Moreover, while this is illustrated for two power supply levels, the approach is clearly extensible to an arbitrarily large number of different supply levels. One of ordinary skill in the art, after reading the description provided herein, will appreciate the factors to consider selecting the number of different supply levels for a particular application. Such factors include, but are not limited to hardware and software complexity, size and cost; desired overall efficiency, and resolution and bandwidth of control hardware.

While exemplary embodiments described herein are directed toward systems with drain bias switching, it should be appreciated that the concepts, systems and techniques described herein also directly apply to other systems and architectures including, but not limited to: systems in which there is switching of the number of amplifiers driving the output together; systems with transistor "width switching;" systems having "gain-stage switching, systems having gate bias switching, as well as systems realizing combinations of the above techniques (e.g., combining two or more of drain bias switching, gate bias switching, gain-stage switching, amplifier switching, and gate-width switching).

Thus, the concepts, systems and techniques introduced herein also directly apply to other systems and architectures having discrete transitions among different operating states (switched-state power amplifier architectures).

Figure 5:
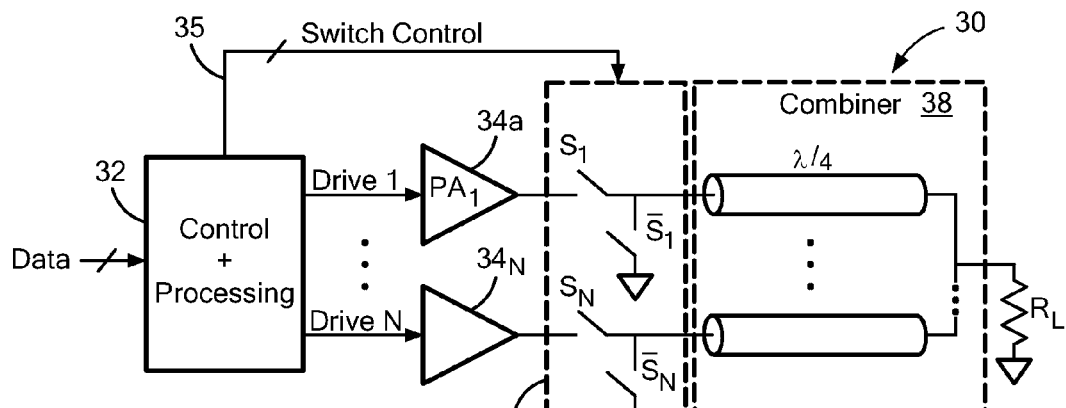
FIG. 5 is a block diagram of a system which dynamically switches a number of power amplifiers which supply an output and compensate an input drive to achieve a desired output power.

One example of a system in which there is switching of the number of amplifiers driving the output together is provided in the exemplary embodiment of FIG. 5, in which dynamic switching is used to select a particular number of PAs to supply an output and compensate an input drive accordingly to achieve a desired power output. Likewise included are systems with transistor "width switching" including those in which one switches among driving different portions of the gate of a PA transistor. Likewise included are systems in which one switches among driving one or more gates of multiple transistors having a common drain connection.

Referring now to FIG. 5, a system 30 includes a control and processing circuit 32 having an input at which data is provided. Control and processing circuit 32 provides drive signals to power amplifiers 34a-34N. In the exemplary embodiment of FIG. 5, control and processing unit includes N outputs each of which is coupled to a corresponding input of one of the N power amplifiers 34a-34N. Other techniques, may of course, be used to couple drive signals from control and processing unit 32 to power amplifiers 34a-34N.

Control and processing unit 32 also provides switch control signals along signal path 35 to a switch circuit 36 comprising a plurality of switch pairs S1, S1'-SN, SN' where the switches in each pair function in a complementary fashion (e.g. S1, S1' are complementary in the sense that when switch S1 is open, switch S1' is closed and vice-versa).

The outputs from switch circuit 36 are coupled through a combiner 38 and provided to a load $R_L$. Combiner 38 combines signals provided thereto in any manner required so as to provide a desired signal to the load $R_L$. Thus, system 30 is an example of a system in which a control system dynamically selects a number of amplifiers utilized to provide an output signal to a load. In this exemplary embodiment, the dynamic selection of the number of amplifiers is accomplished by a dynamic switching technique provided by control circuit 32 and switch circuit 36. Thus, dynamic switching is used to select a particular number of PAs to supply an output and compensate an input drive accordingly to achieve a desired power output. The particular number of amplifiers to dynamically select for any application and/or at any point in time is selected in accordance with a variety of factors including, but not limited to the desired output power level, the characteristics of the amplifiers (e.g. gain, power handling capability, power output rating, etc.), the characteristics of the switch circuit 36 (e.g. insertion loss characteristics, input and output return loss characteristics, switching speed, power handling capability, etc.) and the characteristics of the combiner circuit 38 (e.g. insertion loss characteristics, input and output return loss characteristics, power handling capability, etc.).

Figure 6:
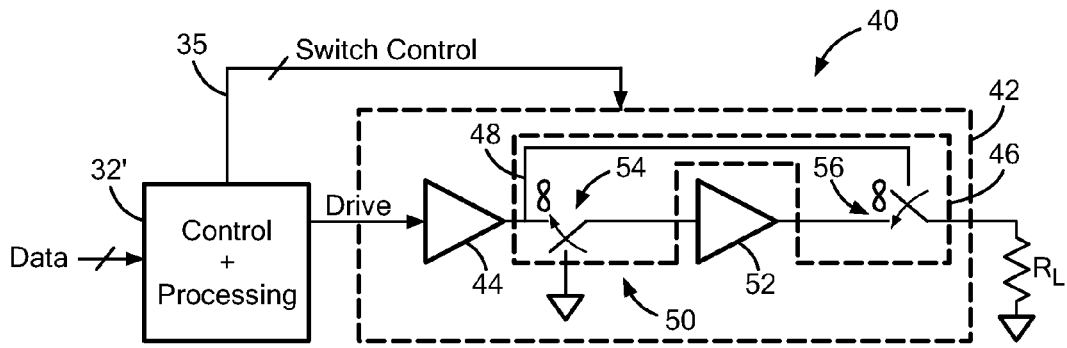
FIG. 6 is a block diagram of a system having gain-stage switching.

Referring now to FIG. 6, the concepts, systems and techniques described herein also find application in systems having "gain-stage switching," in which a variable number of gain stages are used depending upon operating point (as shown in FIG. 6). This also includes systems realizing combinations of the above techniques (e.g., combining two or more of drain bias switching, gain-stage switching, amplifier switching, and gate-width switching).

Turning now to FIG. 6, a system 40, a control and processing circuit 32' having an input at which data is provided. Control and processing circuit 32' may be the same as or similar to, control and processing circuit 32 described above in conjunction with FIG. 5. Control and processing circuit 32' provides drive signal(s) to one or more signal paths 42 (with only one such signal path 42 being shown in FIG. 6) with each such signal path including at least one amplifier 44 (here corresponding to a power amplifier 44) and one or more additional gain stages 46. Each gain stage 46 includes a first no gain signal path 48 and a second gain signal path 50 which includes an amplifier 52 (or other gain providing element or device 52). One or more switching elements 54, 56 (or other means) are disposed to direct signals provided to gain stage 46 to either the no gain signal path 48 or gain signal path 50. Thus, in response to control signals provided thereto from control and processing unit 32', switching elements 54, 56 are operated to either utilize or bypass amplifier 52 depending upon the needs of the particular application.

Figure 7:
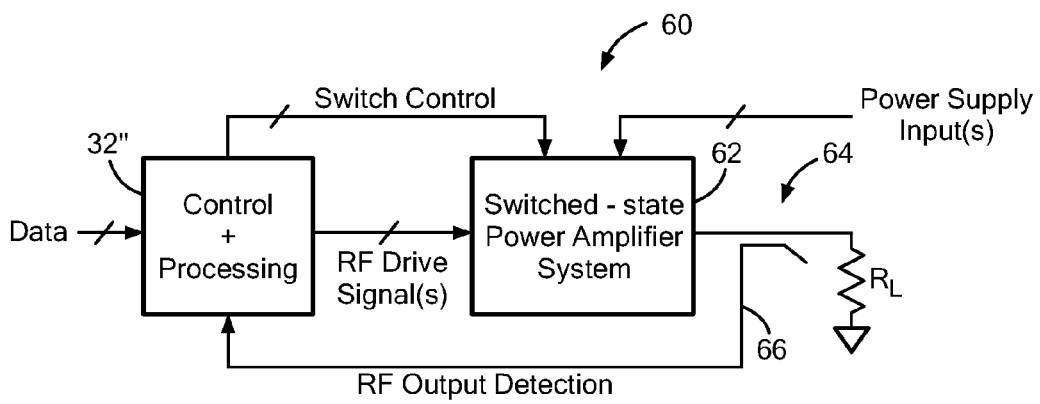
FIG. 7 is a block diagram of a switched-state power amplifier system.

It should be appreciated that the concepts, systems, circuit and techniques described herein may be utilized in switched-state power amplifier systems (or transmitters) as illustrated in FIG. 7, and including the exemplary implementation of FIG. 1. It is noted that there can be a need for such a system to faithfully produce a desired output waveform (e.g., as represented by digital data provided to a power amplifier system or by an RF input signal), with little error in the output. A linear relationship between the signal represented by the input data and the RF output of the PA, is desired. To achieve the high degree of fidelity required in modern communications standards, some amount of linearization of the PA input-output characteristic is usually needed, such as Digital Pre-Distortion (DPD) of the data input to the power amplifier. It is further noted, that while illustrations such as FIG. 7 illustrate a system with a single RF output, the concepts, systems and techniques described herein explicitly apply to systems with multiple data inputs and/or multiple RF outputs, such as "multi-input multi-output" (HMO) transmitter systems.

Turning now to FIG. 7, a system 60 includes a control and processing circuit 32" having an input at which data is provided. Control and processing circuit 32" may be the same as or similar to, control and processing circuits 32, 32' described above in conjunction with FIGS. 5 and 6. Control and processing circuit 32" provides drive signal(s) and state control signals to one or more switched-state power amplifier systems 62 (with only one such system 62 being shown in FIG. 7). An output of switched-state power amplifier system 62 is coupled to a load $R_L$. A coupler 64 couples a portion of the switched-state power amplifier system output signal along an RF output signal detection signal path 66 to an input of control and processing circuit 32".

Figure 8:
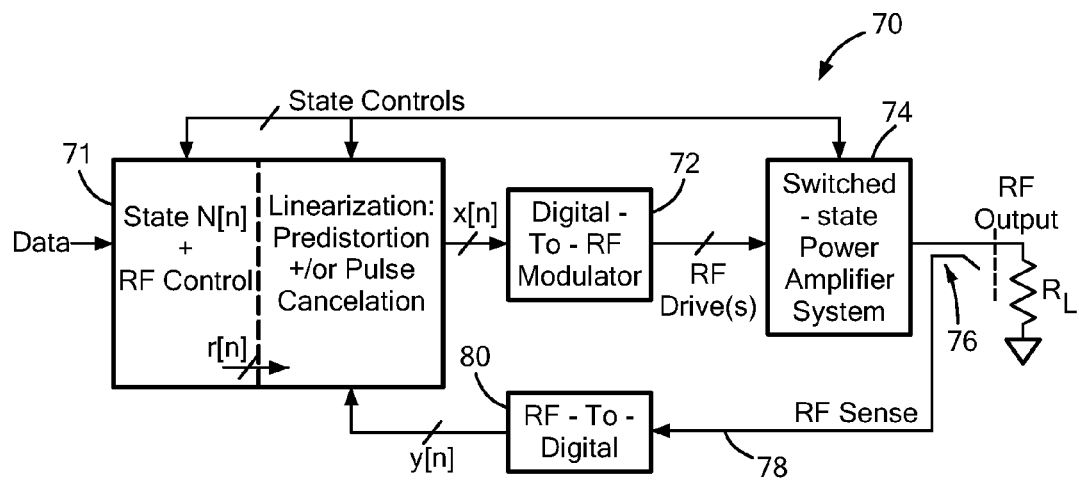
FIG. 8 is a block diagram of an RF amplifier including a state-based digital predistortion (SB-DPD) system.

Referring now to FIG. 8 a system 70 implementing state-based (or supply-based) digital pre-distortion (SB-DPD) includes a command and control circuit 71 which generates state and RF control signals as well as linearization signals (e.g. predistortion and/or pulse cancellation signals) in response to signals provided thereto.

In response to signals provided at inputs thereof, command and control circuit 71 provides state control signals to a linearization (e.g. predistortion and/or pulse cancellation) portion of command and an input of a switched-state power amplifier system 74 and also provides predistorted waveform signals x[n] to an input of a digital-to-RF modulator 72. Digital-to-RF modulator 72 receives the digital signals provided thereto from command and control circuit 71 and provides corresponding RF signals to an input of a switched-state power amplifier system 74.

An output of switched-state power amplifier system 74 is coupled to a load $R_L$. A coupler 76 couples a portion of the switched-state power amplifier system output signal along a signal path 78 to an input of an RF-to-digital processing element 80 which converts the sensed RF signals provided thereto to digital signals y[n] representative of the sensed signals and provides sensed content y[n] to an input of the command and control circuit 71.

Such state-based digital ore-distortion enables smooth (e.g. high-linearity) output to be maintained from a switched-state power amplifier system (e.g. such as that described above in conjunction with FIG. 7) as the operation is switched among different states (e.g., as the drain-bias voltage of the PA is switched among different inputs in the system of FIG. 1).

It should be noted that while exemplary embodiments such as that shown in FIG. 8 illustrate a system with a single RF output, the concepts, systems and techniques described herein explicitly apply to systems with multiple data inputs and/or multiple RE outputs, such as "multi-input multi-output" (MIMO) transmitter systems.

Figure 9:
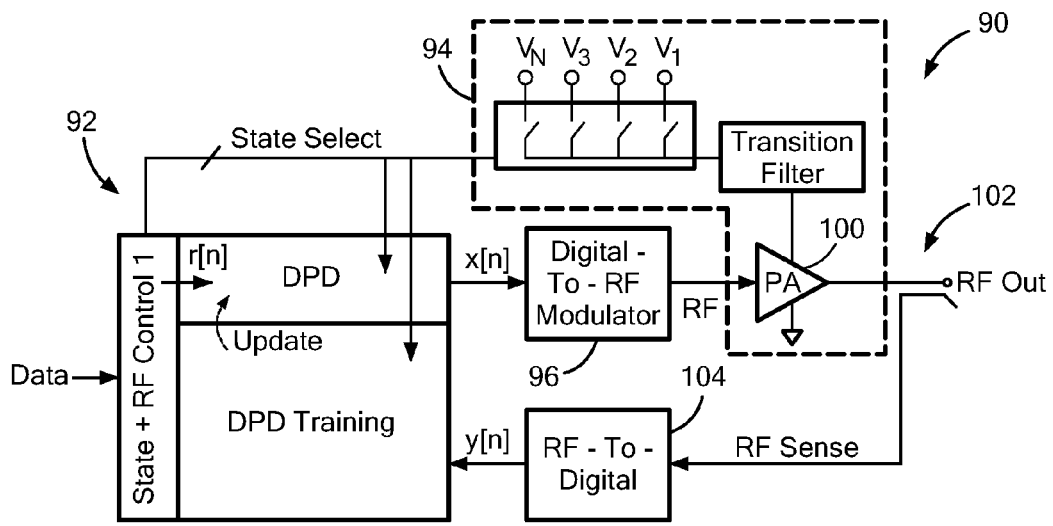
FIG. 9 is a block diagram of an RF amplifier with a switched power supply and including a state-based digital predistortion (SB-DPD) system.

Referring now to FIG. 9, an exemplary system 90 implementing SB-DPD includes a control and command system 92 which accepts digital data as an input; this may be provided as a series of digital words representing samples of the I and Q signals, as equivalent complex numbers, as digital representations of amplitude and phase or related representations of the baseband data to be transmitted at the RE output. To efficiently generate the RF output across high peak-to-average power ratios, a state and RF control system 94 converts the digital data into a combination of one or more state commands (i.e., selecting a power supply input, PA configuration, etc.) and one or more RF drive commands (setting magnitude and phase of the RE drive to the PA input(s)). The state command modulates the state of the switched-state power amplifier system 94 (i.e., selecting the power supply input for the PA), while the RF drive command x[n] is converted to RF by a digital-to-RF modulator 96. The resulting output of a PA 100 is measured via a coupler 102 or other sensing device or element or technique, and the sensed response is provided to an RF-to-digital modulator 104 and transformed into digital form y[n].

The RF signal delivered from digital to RF modulator 96 to the RF input of PA 100 is adjusted (e.g., in amplitude and/or phase) to compensate for the discrete changes in the state of the power amplifier system such that the RF output appropriately represents the data provided for transmission. To accomplish this, accurate time alignment between the state control commands and the RF drive provided to the power amplifier is needed. This alignment can be accomplished by adjusting the relative timing of the signals, with feedback provided by the sensed RF output. Looking at the response of changes in output signal to state and RE drive changes individually and together (e.g., such as by using autocorrellations between commanded and transmitted responses and/or by adjusting relevant alignments in order to minimize error between the input and transmitted signals) provides the means to accomplish this. This alignment may be adjusted as a function of the state in order to provide the best operation across the range of states.

Nonlinearity and time variation of the input-output characteristics of the PA are important constraints on the overall system performance (e.g., in specifications such as EVM and ACPR). In accordance with the concepts, systems and techniques described herein, digital pre-distortion (DPD) is utilized to predistort a desired RF command r[n] into a new command x[n] such that the RF output (and its sensed content y[n]) accurately reflects the desired data. Because the power amplifier characteristics of a switched-state power amplifier vary in practice with the selected state (e.g., with the selected drain voltage supply), a system in which the predistortion is indexed in part by the selected state of the system is described. Firstly, this means that the data selected for computing a predistorted waveform such as x[n] (such as a predistortion lookup table (LUT) mapping r to x, for instance) will be indexed in part by the selected state. In addition, there may be further indexing based on the time (or number of samples) duration from the last state selection change and/or the signal level at the time of the change. For example, separately-indexed tables may be utilized in converting r to x for brief durations after a transition, in order to account for the finite non-zero duration of practical transitions among states. It should be recognized that this approach can be used with different forms of predistortion, including those that incorporate memory (polynomial fits, piecewise linear fits, memory polynomials and other techniques as are known in the art). In systems incorporating memory, one may choose to adjust the information representing memory or history (e.g., previous state data) to reflect the effects of commanded "switched state" changes.

In many systems and in keeping with the concepts, systems, circuit and techniques described herein, the digital predistorter is trained (intermittently or continuously) to identify the correct mapping to provide linearization. As illustrated in FIG. 9, this can be accomplished in an "indirect" learning method, in which a DPD system is trained on samples of transmitted data, and the updated result from training (i.e., an updated mapping of r to x) is periodically transferred to be used in predistorting data. In accordance with the present concepts, systems, circuits and techniques described herein, the DPD training may also be partially indexed by one or more of the selected state of the PA system, the duration since the last transition and the signal level at the transition point. That is, by having the DPD training subsystem respond to what state is selected, DPD data can be generated that is correctly indexed by selected state and other variables of interest.

It should be appreciated that the predistorter and/or predistortion training system may be designed to window or gate captured output data such that training for a given state selection (e.g., supply level selection) is not corrupted or influenced by transient behavior during state switching. So, for example, captured data within a certain number of samples of a state transition (e.g., supply selection transition) may be blanked or gated from inclusion in training of a particular target state (e.g., selected supply level) during the transition among states. Data for training the DPD for output levels near the transition points can still be available from transmit data where the desired output goes near a desired transition point but does not cross it. Moreover, the system can be designed such that there are multiple possible state transition points relative to signal level, such that there will be DPD training data available for all needed signal levels even though there is blanking or gating during transitions. Data that is blanked from training for a target state selection may be included in training for linearization of transition periods.

Figure 10:
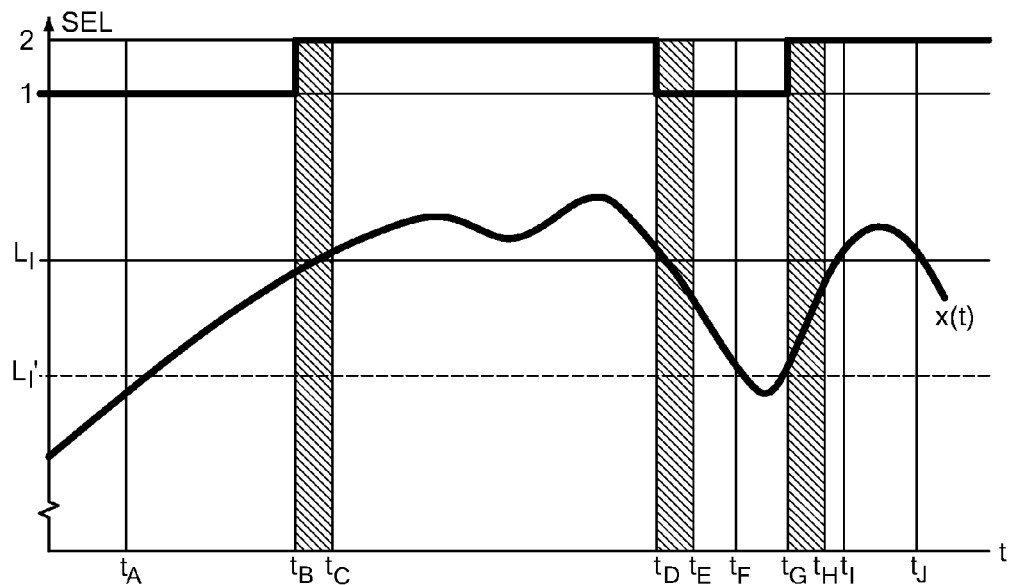
FIG. 10 is a plot of switching threshold values, signal amplitude and level selection versus time.

Referring now to FIG. 10, a plot of level vs. time is shown. The aspects described above in conjunction with FIG. 9 are illustrated in FIG. 10. In FIG. 10, $x(t)$ is an envelope of a transmit signal, $L_1$ is a first switching threshold used for switching between discrete states 1 and 2 (e.g., selection from power supply 1 and power supply 2), $L_1'$ is a second switching threshold used for switching between states 1 and 2, "SEL" indicates the selection between states 1 and 2, and the "greyed" sections of the plot indicate gating or blanking windows during which the state may be in a transition period (e.g., the supply voltage provided to the PA is transitioning between that of supply inputs 1 and 2, the power amplifier is in a transient state owing to such a transition, etc.) Prior to time $t_B$, the system is in state 1, and the captured response (of the sensed output) is used to train the DPD for linearization of discrete state 1. At $t_B$, threshold $L_1$ is crossed in the positive direction, and the system initiates switching to discrete state 2. This transition may take a finite nonzero time (e.g., for the supply voltage provided to the PA to settle to a new level associated with state 2). Consequently, the duration between $t_B$ and $t_C$ is not used for training the DPD for linearization for state 2, though it may be used for linearization of the system during the transition (e.g., populating predistortion information for linearization during the state 1 to state 2 transition, for pulse cancellation, etc.) Nevertheless, data for linearizing the system in state 2 for the appropriate level of signal $x(t)$ (just above $L_1$) is available from other time points in the signal (e.g., between $t_C$ and $t_D$ and between $t_I$ and $t_J$). Likewise, data from between times $t_D$ and $t_E$ are not used to provide information for predistortion indexed for state 1, but other data (such as between $t_A$ and $t_B$) is available for this purpose. It is also notable that the use of the second switching threshold $L_1'$ for transition from state 1 to state 2 for some transitions (e.g., at time $t_G$) enables additional linearization data for state 2 to be captured (e.g., from the response after $t_H$) beyond that available if only a single transition threshold were provided. Utilization of multiple transition thresholds between two states is thus used to benefit linearization of the system. Moreover, one can use multiple transition thresholds to increase durations and/or guarantee minimum durations in particular states (e.g., the duration of the state 2 after $t_G$ is longer owing to the use of $L_1'$ than if $L_1$ were used on that transition.) In all of the above, it should be noted that one might select different transition thresholds for "positive/up" and "negative/down" transitions. Lastly, one may have additional predistortion tables for during the transient duration of specific transitions (e.g., one or more sets of separate DPD parameters/tables/indices used for transient durations as between $t_B$ and $t_C$–1 to 2 switching at $L_1$; between $t_D$ and $t_E$–2 to 1 switching at $L_1$; and between $t_G$ and $t_H$–1 to 2 switching at $L_1'$.)

Embodiments of the proposed system may dynamically select among multiple (e.g., a discrete set) or variable transition thresholds for selecting among states in order to provide increased performance and/or to ensure sufficient durations in particular states while maintaining high efficiency. (These transition thresholds may also be adapted over time or to match the characteristics of individual power amplifiers.)

Figure 11:
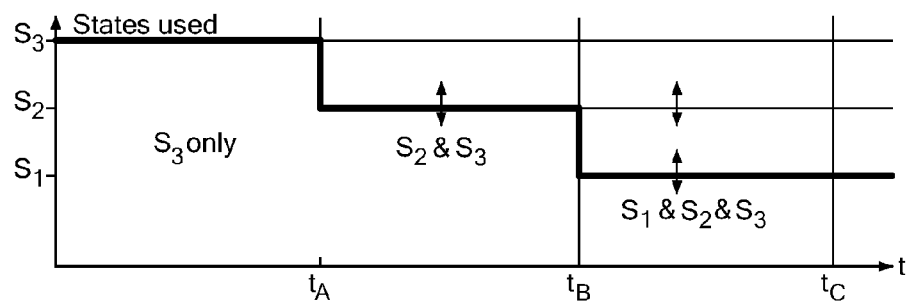
FIG. 11 is a plot of discrete states versus time.
Figure 12:
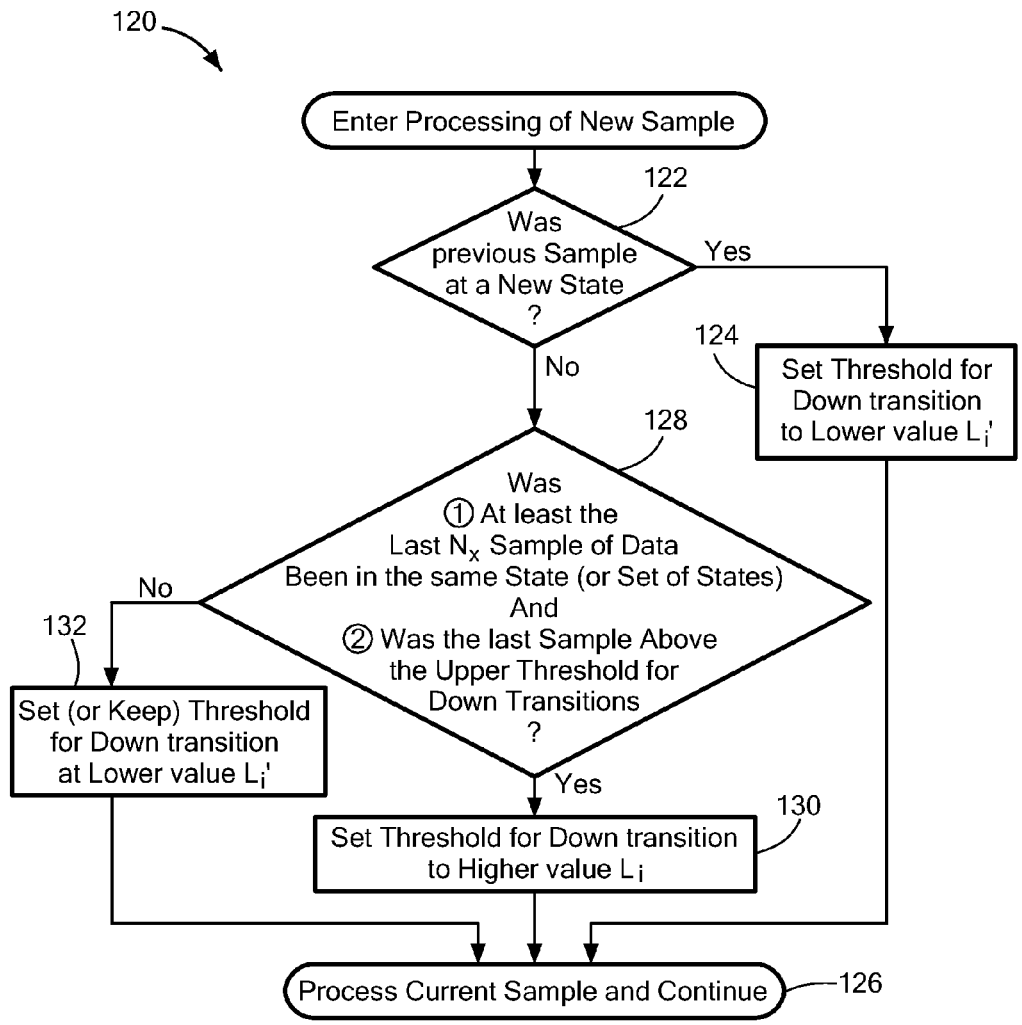
FIG. 12 is a flow diagram of a process for dynamically selecting transition thresholds.
Figure 13:
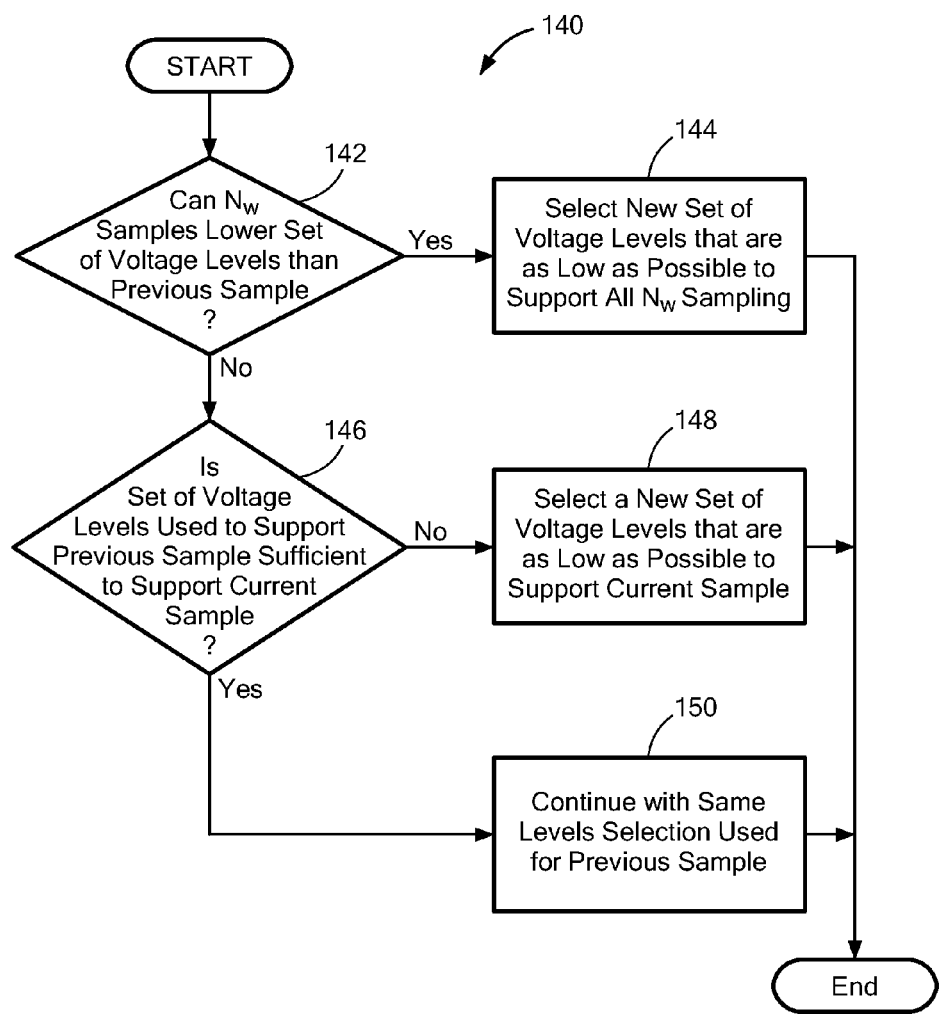
FIG. 13 is a flow diagram of a process for selecting levels.

FIGS. 12 and 13 are flow diagrams showing the processing performed by a processing apparatus which may, for example, be provided as part of an SB DPD system such as that described in any of FIGS. 1-11 and 14-16. The rectangular elements (e.g. block 124 in FIG. 12) in the flow diagrams are herein denoted "processing blocks" and represent steps or instructions or groups of instructions. Some of the processing blocks can represent an empirical procedure or a database while others can represent computer software instructions or groups of instructions. The diamond shaped elements in the flow diagrams (e.g. block 122 in FIG. 12) are herein denoted "decision blocks" and represent steps or instructions or groups of instructions which affect the processing of the processing blocks. Thus, some of the processes described in the flow diagram may be implemented via computer software while others may be implemented in a different manner e.g. via an empirical procedure.

Alternatively, some of the processing and decision blocks can represent processes performed by functionally equivalent circuits such as a digital signal processor (DSP) circuit or an application specific integrated circuit (ASIC). The flow diagrams do not depict the syntax of any particular programming language. Rather, the flow diagrams illustrate the functional information one of ordinary skill in the art requires to perform the processes or to fabricate circuits or to generate computer software to perform the processing required of the particular apparatus. It should be noted that where computer software can be used, many routine program elements, such as initialization of loops and variables and the use of temporary variables are not shown. It will be appreciated by those of ordinary skill in the art that unless otherwise indicated herein, the particular sequence of processes described is illustrative only and can be varied without departing from the spirit of the concepts, systems and techniques disclosed herein.

Figure 14:
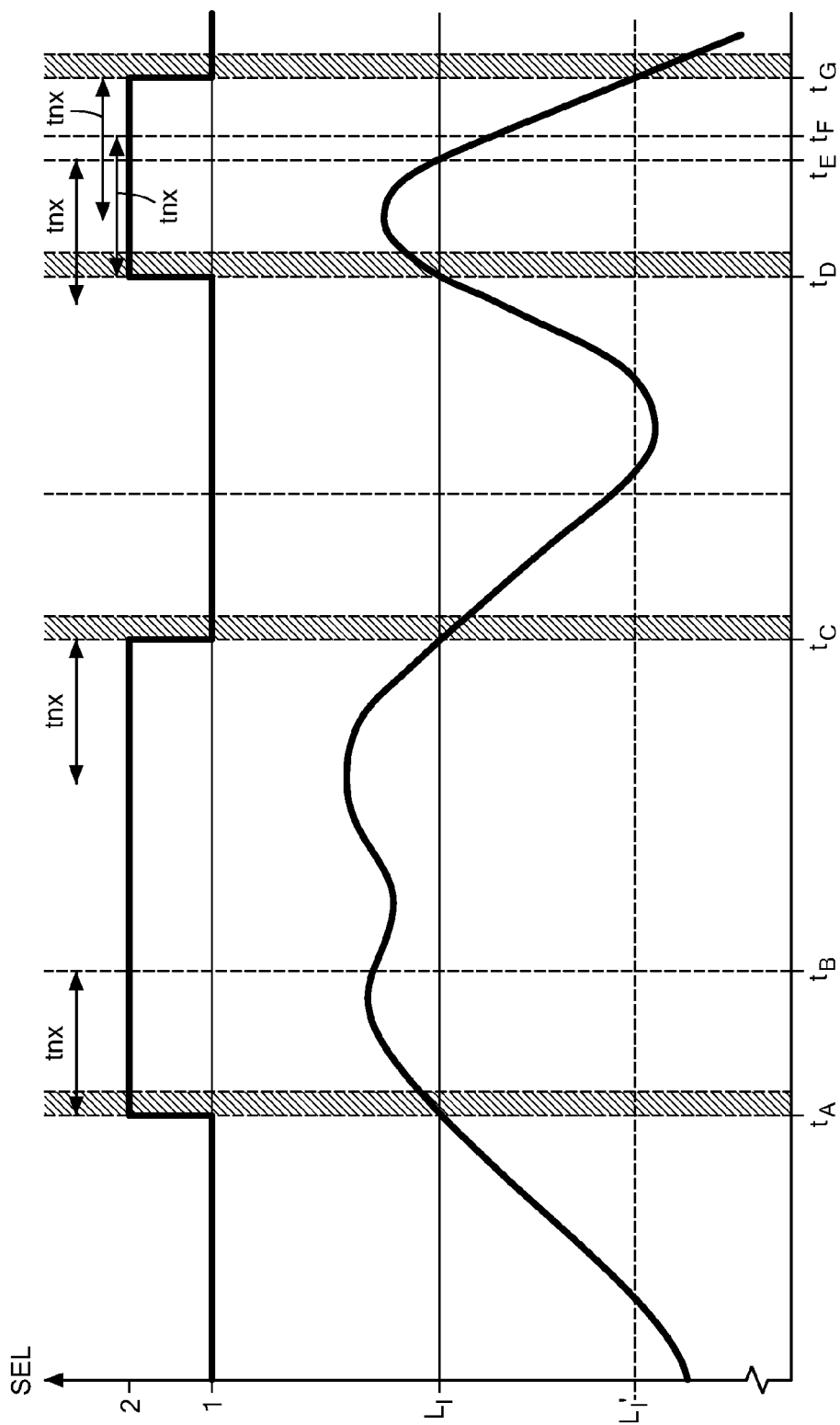
FIG. 14 is a plot of switching threshold values, signal amplitude and level select versus time.

In FIG. 12, an exemplary process for dynamically selecting transition thresholds is illustrated. The resulting thresholds (updated at each sample point) can be used either with "instantaneous" level selection (i.e., based only on the relative value of the current sample with respect to the selected switching threshold(s)), or with more sophisticated level selection techniques such as that shown in FIG. 13. Representative resulting waveforms are shown in FIG. 14.

Turning now to FIG. 12, the processing of a new sample begins as shown in decision block 122 where a decision is made as whether a previous sample was at a new state. If a decision is made that previous sample was at a new state, then processing proceeds to processing block 124 where a threshold is set for a down transition to a lower threshold value $L_1'$. Processing then proceeds to processing block 126 where the current sample is processed and processing continues.

If in decision block 122 a decision is made that previous sample was not at a new state, then processing proceeds to decision block 128. In decision block 128 two conditions are checked: (1) have at least the last $N_x$ samples of data been in the same state (or set of states); and (2) was the last sample above the upper value used for "down" transition situations. If these two conditions are both satisfied, then processing proceeds to processing block 130 in which the threshold for "down" transitions is set to the upper level $L_1$. Processing then proceeds to processing block 126 where the current sample is processed and processing continues.

If in decision block 128, a decision is made that at least one of these two conditions are not satisfied, then processing proceeds to processing block 132 in which the threshold for down transitions is set (or held) at the lower value of $L_1'$. Processing then proceeds to processing block 126 where the current sample is processed and processing continues.

Thus, the exemplary transition threshold selection technique described in conjunction with FIG. 12 uses a single threshold (in each state) for "up" transitions (level $L_1$) but for "down" transitions from a given state the threshold is selected among two values (a higher value $L_1$ or a lower value $L_1'$) depending upon circumstances (the L1 value could be different for up and down transitions, but they are shown as the same here for simplicity.) When processing each sample, before making transition decisions, the threshold level(s) are updated (one can update the "up" thresholds individually or for all states together). Alternatively, it is possible to update the "down" threshold for the state selection used in the previous sample.) If the previous sample used a state selection different than that of the sample before, (a "new" state on the previous sample), the threshold for down transitions is set to the lower value $L_1'$. Otherwise, it is checked if both: 1.) the state selection was the same for the last $N_x$ samples (a "minimum" duration) and 2.) the signal at the last sample is above the upper value used for "down" transitions $L_1$. If so, the threshold for "down" transitions is set to the upper level $L_1$; otherwise it is held at the lower value of $L_1'$. The resulting selected threshold is then used to make level selection decisions according to the technique selected (e.g., as in FIG. 13).

FIG. 13 is thus a flow diagram of a process for selecting levels. The technique described in conjunction with FIG. 13 may be referred to as "transition reduction." As noted above, the transition thresholds for use in this technique can be dynamically selected as described in conjunction with FIG. 12.

It should be noted that while the threshold selection process described in conjunction with FIG. 12 and level selection (e.g., by "instantaneous" comparison of the signal to thresholds or on a window of data as in FIG. 13 below) are described as sequential, separate processes, they can be merged. That is, the processes of selecting thresholds and making level decisions needn't necessarily be done sequentially but can be done together in parallel or in an interleaved manner while maintaining the overall benefit.

It should be appreciated that the particular threshold selection technique described in conjunction with FIG. 12 helps ensure a sufficient (ideally minimum) duration in a state after transitions "up" into a higher state from a lower state. In one embodiment, (level selection decisions are based either upon the specific current sample being processed, or with level selection decisions based upon a window of data as in the technique of FIG. 13. The window-based level selection technique of FIG. 13 (incorporating "transition reduction") further ensures a sufficient (ideally minimum) duration in a state after transitions "down" into a lower state from a higher state.

Turning now to FIG. 13, a method 140 for selecting voltage levels for one or more power amplifiers of a power amplification system based upon a window of samples begins as shown in decision block 142 where a decision is made as to whether $N_W$ samples can use a lower set of voltage levels than a previous sample and still meet output power requirements. If in decision block 142 a decision is made that a lower set of voltage levels can be used, then processing proceeds to processing block 144 where a new set of voltage levels that are lower than the previous sample (and preferably as low as possible) are selected to support all $N_W$ samples and the selection process ends.

If in decision block 142 a decision is made that a lower set of voltage levels cannot be used, (i.e. if the $N_W$ samples cannot use a lower set of voltage levels than the previous sample), then processing flows to decision block 146 where it is determined whether the set of voltage levels used for the previous sample is sufficient to support the current sample.

If in decision block 146 a decision is made that the set of voltage levels used for the previous sample is not sufficient to support the current sample, then a new set of voltage levels may be selected that are as low as possible to support the current sample as shown in processing block 148 and selection processing ends.

If in decision block 146 a decision is made that the set of voltage levels used for the previous sample is sufficient to support the current sample, then processing proceeds to processing block 150 and the same level selection is used for the current sample as was used for the previous sample. This process may be repeated for each new sample.

Referring now to FIG. 14, example waveforms illustrating the effect of the threshold selection process of FIG. 12 are illustrated in FIG. 14. Before time $t_A$, the system is in state 1. When the signal reaches time $t_A$, it exceeds $L_1$, and the system switches to state 2. The "down" threshold (setting switching from state 2 to 1) is updated to be $L_1'$ in the next sample. After a number of samples $N_x$ (corresponding to a time duration $t_{nx}$) the system has been operating in state 2 for $N_x$ samples and the signal is above level $L_1$, so the "down" threshold is updated to $L_1$ at time $t_B$. Consequently, the system switches from state 2 to state 1 at time $t_C$, when the signal falls below $L_1$. The state again changes to state 2 at time $t_D$, when the signal again exceeds $L_1$, and the "down" threshold is updated to $L_1'$. Since the level signal has fallen below $L_1$ by time $t_E$ before time $t_F$ when the system has been in its present state for $N_x$ samples, the lower threshold is used for the down transition occurring at time $t_G$. In this case, the duration in state 2 is extended beyond that which would have occurred if only $L_1$ were used. This method thus balances achieving high efficiency (e.g., by using $L_1$ at time $t_C$) with the desire for minimum durations in each level (e.g., by using $L_1'$ at time $t_G$).

There are also advantageous methods for pretraining or initializing the DPD system, either with live data or with test sequences, in a system with multiple states, it is advantageous to first linearize the system for the state providing operation across the broadest (and/or full) output range, and then successively include operating states covering narrower output ranges (preferably successively linearizing states providing successively narrower output ranges). For example, consider a system switching among 3 discrete states $S_1$ through $S_3$, where $S_3$ can achieve the full output power range, $S_2$ can achieve a reduced output power range, and $S_1$ can achieve a further reduced output power range. (This could occur in a system switching among three power supply levels, with $S_3$ using the largest, $S_2$ the second largest and $S_1$ the smallest supply voltage.)

This process is illustrated in FIG. 11.

To initialize the DPD system, one could initiate operation in state $S_3$. After linearizing in state 3 sufficiently (at time $t_A$), the system could then switch to an operating mode using both $S_3$ and $S_2$, and linearize for $S_2$ as well as $S_3$ (between time $t_A$ and $t_B$). Finally, the system could incorporate use of all of $S_1$-$S_3$ and achieve linearization of $S_1$ (after time $t_C$). By starting with the state that can reach the full operating range of the system, linearizing for that state, and successively moving to incorporate operation of reduced-operating-range states and linearizing operation for those states (preferably from the largest range state to the smallest), the system can be linearized more quickly and stably.

It should be noted that the techniques described here are applicable to systems with a plurality of power amplifiers, including where each power amplifier has a corresponding set of states or to systems where there is a set of states common to the amplifiers.

Figure 15:
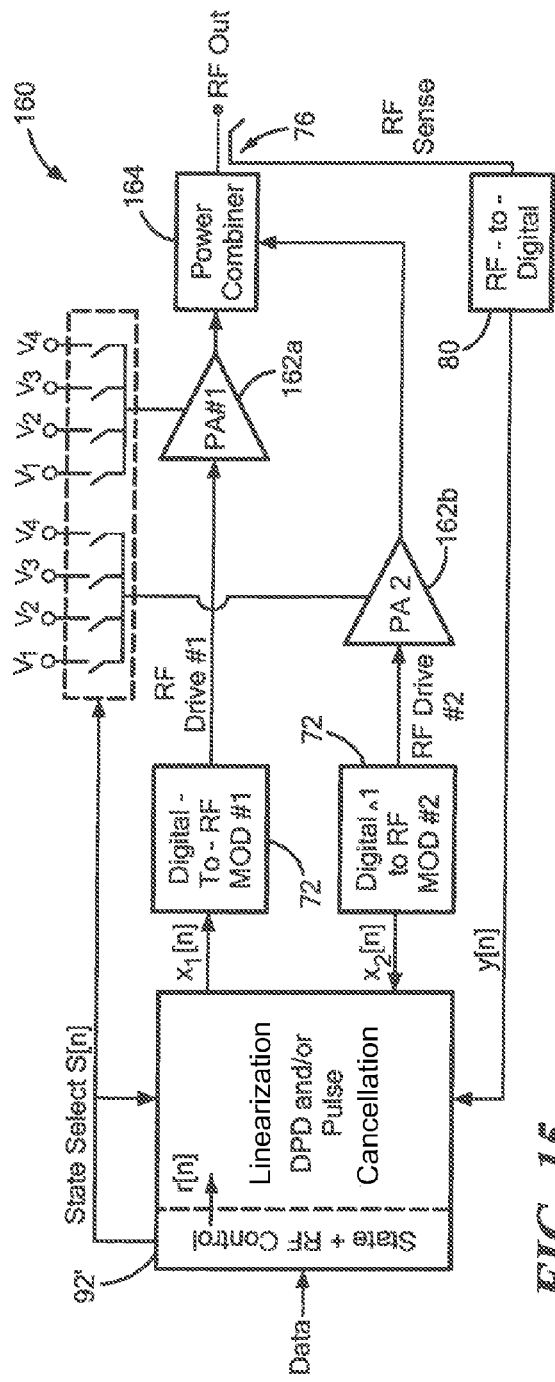
FIG. 15 is a block diagram of a system having two power amplifiers each of which can have their drain supply voltage selected from a plurality of voltages, along with a power combiner to combine the individual PA outputs into a single output and a subsystem for controlling the power amplifiers.

For example, FIG. 15 in which like elements of FIGS. 8 and 9 are provided having like reference designations, a system 160 comprising two power amplifiers (PAs) 162a, 162b each of which can have bias voltages (e.g. drain supply voltages) selected from a plurality of voltages V1-V4; V1'-V4', along with a power combiner 164 to combine the individual PA outputs into a single output. It should be appreciated that voltages V1-V4 and V1-V4' may all be unique voltage levels or may be the same voltages (e.g. V1=V1', V2=V2", etc. . . . )

In such a system, each PA may have a state associated with it (e.g., which power supply is selected), and the whole system has an overall state (i.e., the power supply selections for the whole system), such that for a particular state of a given PA the system may exist in a particular set of the overall states. Transition thresholds and updates in such a system may be based on a "per-PA basis" (e.g., transitions thresholds set based on the duration over which a particular PA is in a certain state or during which the overall system is within a particular set of states, and transitions based on the signal applied to individual PAs with respect to their individual thresholds). Alternatively, the system may be considered as a whole and treated as having a unique set of states. In this case, transition decisions may be made comparing multiple signals to multiple thresholds, and decisions regarding thresholds made based on duration in a particular state or among particular sets of states.

Digital predistortion may be carried out in multiple manners consistent with the concepts, systems and techniques described herein. One may perform State-Based DPD on each PA independently with respect to its states. One may then optionally perform a system-level DPD process that runs on top of the individual PA linearization. Alternately, one may treat the system as a single large state-based power amplifier system and run a single SB-DPD algorithm. It may, in some applications be, particularly valuable to spot the signals to the multiple PAs such that the contributions and performance of the individual PAs are observable from the received signal in order to provide robust, stable adjustment of the linearization over time. Moreover, in performing DPD, it can be important to provide a means to achieve relative time alignment of the RF drive paths, as well as aligning RF paths to drain paths.

When a system corresponding to a power amplifier system such as that described in conjunction with FIGS. 7 and 8 for example is changed among different discrete states, undesired components may be injected into the PA output.

In the system of FIG. 9, for example, the power supply input switching among different levels may result in unwanted components being injected into the output at RF frequencies. The PA drain bias supply acts as a second input (in addition to the PA RF input), such that when the PA drain bias voltage switches sources (e.g., among different discrete levels), a disturbance "pulse" is introduced into the RF output of the PA system. This includes, for example, effective dynamic complex gain variations of the PA while the PA is transitioning. This can be partly addressed by control of the transitions among different supply levels (e.g., through transition filtering or other means.) Nevertheless, given that supply transitions can happen at a high rate, this can introduce significant energy into the output that does not represent the desired signal. The disturbances can appear as an increase in apparent "broadband noise" in the output spectrum of the power amplifier system. More generally, a temporary disturbance or pulse in the output may occur when the system is switching among discrete operating modes or among states.

A "pulse cancellation" technique can be used to address the problem of state changes introducing unwanted components in the output spectrum. In the pulse cancellation technique, the effects of a disturbance or other type of variation (e.g., at the drain input of the PA) are compensated (or "cancelled") at the PA output by introducing a signal via the RF input of the PA. The output of the PA may vary from the desired value in both magnitude and phase during (and around) the transition, yielding an error in the RF output waveform. Considering time-aligned versions of the signals representing the commanded, transmitted, and sensed data, one may generate commands to the PA system x[n] and s[n] (setting the RF drive and state) and find e[n]=y[n]−r[n], where r[n] is the desired reference signal to output, y[n] is the digitized baseband version of the generated output, and e[n] is the error between the desired output and the generated output, where n may be referenced (for a given transition) to a time where deviations start to occur owing to the state transition. One may consider a limited effective pulse duration of n=1 . . . N samples. It is likewise possible to operate with the continuous-time version of these signals, either at baseband or RF. For a given transition, it is possible to approximate the error pulse with a signal e'[n] as:

$$e'[n] = G_0[n] + G_1[n] * r[n]$$

where $G_0[n]$ represents a data-independent dynamic error and $G_1[n]$ represents a dynamic gain error. In a simplification that is applicable in many cases, one may estimate that $G_0[n]$ is approximately zero and work only with $G_1[n]$ (or vice versa). More generally, one could consider higher-order polynomial fits between the data and the error (e.g., including square, cube, or higher terms in r), or could consider a "memory polynomial" formulation in which e[n] is approximated as a sum of contributions deriving from present data and data at time earlier than n.

By collecting error information from numerous transitions, estimates of the values of the coefficients (e.g., $G_0[n]$ and $G_1[n]$) that occur for n=1 . . . N of each transition can be made. (It is possible to use more or less coefficients as desired depending on the formulation. Also, in estimating pulses, it is possible to utilize or include data that is "blanked" or "masked" for DPD, as described above.) Values for the coefficients characterizing the pulses can be obtained through least-squares calculations, for example. Based upon this estimation of the deviation, a "cancellation pulse" p(t) can be synthesized, and injected into the data stream:

$$p[n]=-e'[n]-(G_0[n]+G_1[n]*r[n])$$

Figure 16:
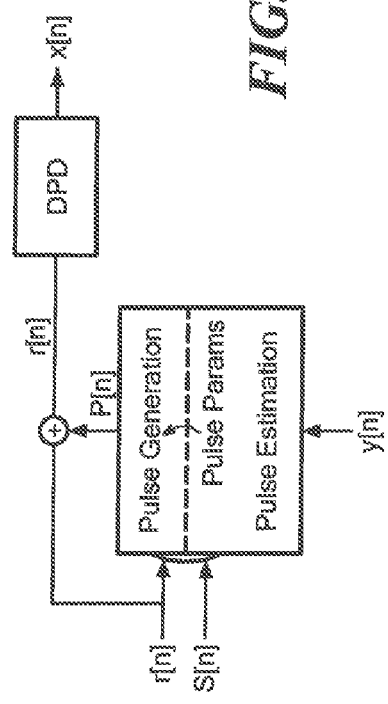
FIG. 16 is a block diagram of a pulse cancellation portion of the linearization block in FIG. 8.

Referring now to FIG. 16, a pulse cancellation system 170 includes a pulse estimation processor 172 which generates pulse parameters and provides the parameters to a pulse generation processor. The pulse estimation and pulse generation processors develop a pulse p[n] and provides the pulse to a first input of a summing circuit 174. A second input of the summing circuit receives a data stream r[n] and an output of the summing circuit is coupled to an input of a DPD system 176. It should be noted that the pulse cancellation system of FIG. 16 may be the same as or similar to the "pulse cancellation" portion of the exemplary linearization block illustrated in FIG. 8.

When a state transition occurs, an appropriate pulse is injected that provides "feedforward" nulling of the error associated with the pulse. It should be noted that the system of FIG. 16 shows the pulse p[n] being developed and fed to the input of the DPD system. This is often preferable for highest performance, as one wants to replicate p[n] in the output well (such that "linear" cancellation occurs). However, in some cases it may be desirable to synthesize and inject cancellation pulses into the data stream based on signals after the DPD (e.g., add p[n] to the DPD output signal to form x[n] to drive the digital to RF modulator). Also, in cases where only $G_1$ is of interest (that is, the system performance is determined largely as a time varying gain during the transition), effective pulse cancellation can be performed by finding a dynamic gain $$G_{1A}[n]=1/(1+G_1[n])$$

and multiplying the data stream r[n] (or x[n]) by $G_{1A}[n]$ to find the "pulse corrected" signal. This multiplicative technique is equivalent to the additive $G_1$ component in p[n] for small error coefficients $G_1$ and is applicable even if $G_1$ is not small. In all of these techniques, it is important to note that one must carefully address the time alignment of the compensation pulse with the transition and data signals, such that the pulse properly cancels the error.

Additional opportunities arise in systems having multiple power amplifiers, such as that in the exemplary embodiment of FIG. 15 where two amplifiers are shown (in general, however, a plurality of amplifiers may be used). Such systems include designs implementing "Asymmetric Multilevel Outphasing" or "Asymmetric Multilevel Backoff". Often in such designs, the states of the Individual PAs do not change simultaneously. Consequently, when one PA changes state (e.g., the supply voltage source for that PA changes), at least one other PA continues to operate in the same state (The state of the overall system is transitioning to a new state within a subset of the overall states). In such cases it is advantageous to inject a cancellation pulse to correct a disturbance owing to a supply (or state) transition of one PA through a second PA that is not undergoing a state transition at that time. This is because the second PA will operate in a more linear fashion during the transition of the first PA than the first PA itself will. So, for example, in the system of FIG. 15, a pulse compensating for the disturbance occurring when PA1 has a state transition can be injected via the data stream (leading to $x_2[n]$) for the second power amplifier PA2, and vice versa. In some systems, one may have a PA that does not undergo discrete transitions, and may use this PA to inject cancellation pulses for other PAs that do.

Having described exemplary embodiments of the invention, it will now become apparent to one of ordinary skill in the art that other embodiments incorporating their concepts may also be used. For example, the inventive designs and methods for providing improved linearity in power amplifier systems in which component power amplifier(s) are switched among a set of operating states can be applied to RF amplifier systems in which drain bias voltages for one or more constituent power amplifiers in the RF amplifier system are dynamically selected from more than one possible source or level (e.g., switched between multiple discrete supply voltages.)

Accordingly, the concepts described herein should not be limited to disclosed embodiments but rather should be limited only by the spirit and scope of the appended claims. All publications and references cited herein are expressly incorporated herein by reference in their entirety.

What is claimed is:

1. A radio frequency (RF) system having an input and an RF output, the system comprising:
    one or more RF amplifiers each having an RF input, an RF output, and a power supply input; and
    a voltage control unit coupled to provide a power supply voltage to the power supply input of at least one of the one or more RF amplifiers, wherein the voltage control unit is configured to dynamically select the power supply voltage from among 3 or more discrete voltage levels based at least in part upon one or more signal characteristics of a signal to be amplified and upon a window of data related to one or more signal characteristics of the signal to be amplified, the window corresponding to a set of data samples; and
    a pulse cancellation system, coupled to at least one of the one or more power amplifiers, the pulse cancellation system configured to receive at least a portion of an RF signal and to generate one or more cancellation signals wherein the one or more cancellation signals are based, at least in part, upon the portion of the RF signal and at least partially cancel variations at the RF output of the RF system caused by switching among the discrete voltage levels, the one or more cancellation signals introduced at the RF input of at least one of the one or more RF amplifiers.

2. The system of claim 1, wherein the one or more RF amplifiers are provided as one or more RF power amplifiers.

3. The system of claim 1, wherein the voltage control unit dynamically selects the power supply voltage from among 4 or more discrete voltage levels based at least in part upon one or more signal characteristics of the signal to be amplified and upon the window of data related to the one or more signal characteristics of the signal to be amplified.

4. The system of claim 1, wherein the power supply voltage provided to the power supply input of the at least one RF amplifier by the voltage control unit is selected from among the 3 or more discrete voltage levels for a first set of operating conditions and is derived from an input that provides continuous envelope tracking for other operating conditions not included in the first set.

5. The system of claim 1, wherein disturbances in the RF output of the system owing to changes in the selected power supply voltage level of at least one of the one or more RF amplifiers are compensated for by a signal applied via the RF input of at least one of the one or more RF amplifiers.

6. The system of claim 5, wherein the system has first and second power amplifiers, and wherein disturbances in the RF output of the system owing to changes in the power supply input selection of the first power amplifier are compensated by a signal introduced via the RF input of the second power amplifier.

7. The system of claim 5, wherein the compensation signal is introduced as an additive component in a baseband signal.

8. The system of claim 5, wherein the compensation signal is introduced as a multiplicative factor applied to digital data in a baseband signal.

9. The system of claim 1, further comprising:
a linearization unit coupled to each of the RF amplifiers associated with the voltage control unit, the linearization unit to improve the linearity of the system by predistorting the RF input to at least one of the one or more RF amplifiers, wherein the predistortion is indexed, at least in part, to the selected power supply voltage level.

10. A radio frequency (RF) power amplifier system having an input and an RF output, comprising:
one or more power amplifiers each having an RF input, an RF output, and a power supply input, wherein a power supply voltage provided to the power supply input of at least one of the one or more power amplifiers is dynamically selected from among 3 or more different voltage levels based at least in part upon one or more signal characteristics of a signal to be amplified and upon a window of data related to one or more signal characteristics of the signal to be amplified, the window corresponding to a set of data samples; and
a pulse cancellation system, coupled to at least one of the one or more power amplifiers, the pulse cancellation system configured to receive at least a portion of an RF signal and in response thereto to generate one or more cancellation signals to at least partially cancel variations in RF signals at the RF output of the power amplifier system caused by switching among the discrete voltage levels, the one or more cancellation signals introduced at the RF input of at least one of the one or more power amplifiers, the one or more cancellation signals based, at least in part, on the portion of the RF signal received by said pulse cancellation system.

11. The power amplifier system of claim 10, wherein the power supply voltage provided to the power supply input of the at least one power amplifier is dynamically selected from among 4 or more different voltage levels based at least in part upon one or more signal characteristics of the signal to be amplified and upon the window of data related to one or more signal characteristics of the signal to be amplified.

12. The power amplifier system of claim 11, wherein variations in an RF output signal at the RF output of the power amplifier system owing to changes in selection of a power supply input of at least one of the one or more power amplifiers are compensated by a compensation signal provided to the RF input of at least one of the one or more power amplifiers.

13. A radio frequency (RF) power amplifier system having a data input and an RF output, comprising:
one or more power amplifiers that are switched among a discrete set of 3 or more operating states based at least in part upon data provided to the data input of the power amplifier system, the data comprising one or more signal characteristics of the signal to be amplified, and a window of data related to the one or more signal characteristics of the signal to be amplified, the window corresponding to a set of data samples; and
a pulse cancellation system, coupled to at least one of the one or more power amplifiers, the pulse cancellation system coupled to receive at least a portion of an RF signal and configured to generate one or more cancellation signals to at least partially cancel variations at RF output of the RF power amplifier system caused by switching among the discrete operating states, the one or more cancellation signals introduced at an input of at least one of the one or more power amplifiers, the one or more cancellation signals based, at least in part, on the portion of the RF signal receive by said pulse cancellation system.

14. The power amplifier system of claim 13, wherein the discrete set of 3 or more operating states is determined at least in part by the selection of at least one drain bias voltage for at least one of the one or more power amplifiers, wherein the at least one drain bias voltage is selected from among multiple sources or levels.

15. The power amplifier system of claim 13, wherein:
the one or more power amplifiers includes multiple power amplifiers, each of the multiple power amplifiers having one or more operating states; and
the set of operating states for each of the multiple power amplifiers is determined at least in part by the number of power amplifiers selected to provide power amplification.

16. The power amplifier system of claim 13, further comprising:
a pulse cancellation system, coupled to at least one of the one or more power amplifiers, to at least partially cancel variations in an RF output signal at the RF output of the power amplifier system caused by switching among the discrete set of operating states by introducing a cancellation signal at the RF input of at least one of the one or more power amplifiers.

17. The power amplifier system of claim 16, further comprising:
a coupler to couple at least a portion of the RF output signal of the power amplifier system to the pulse cancellation system, wherein the pulse cancellation system is configured to generate one or more cancellation signals based, at least in part, from the coupled signal.

18. The power amplifier system of claim 16, wherein:
the one or more power amplifiers are switched among a discrete set of 4 or more operating states based at least in part upon the data provided to the data input of the power amplifier system.

19. The RF system of claim 1, wherein the window comprises a moving window.

20. The RF power amplifier system of claim 10, wherein the window comprises a moving window.

* * * * *

UNITED STATES PATENT AND TRADEMARK OFFICE
CERTIFICATE OF CORRECTION

| | |
|---|---|
| PATENT NO. | : 9,172,336 B2 |
| APPLICATION NO. | : 13/955952 |
| DATED | : October 27, 2015 |
| INVENTOR(S) | : Mark A. Briffa et al. |

It is certified that error appears in the above-identified patent and that said Letters Patent is hereby corrected as shown below:

In the drawings

Page 1/10, FIG. 1 (box 26) delete "Transistion" and replace with --Transition--.

Page 5/10, FIG. 8 (box 71) delete "Predistortion" and replace with --Pre-distortion--.

Page 5/10, FIG. 8 (box 71) delete "Cancelation" and replace with --Cancellation--.

Page 7/10, FIG. 12 (box 124) delete "$L_i'$" and replace with --$L_1'$--.

Page 7/10, FIG. 12 (box 130) delete "$L_i$" and replace with --$L_1$--.

Page 7/10, FIG. 12 (box 132) delete "$L_i'$" and replace with --$L_1'$--.

In the specification

Column 1, line 50 delete "Rackoff" and replace with --Backoff--.

Column 1, line 65 delete "predistortion" and replace with --pre-distortion--.

Column 2, line 12 delete "predistortion" and replace with --pre-distortion--.

Column 2, line 15 delete "State Based" and replace with --State-Based--.

Column 2, line 63 delete "by as signal" and replace with --by a signal--.

Column 3, line 13 delete "predistortion" and replace with --pre-distortion--.

Column 4, line 7 delete "predistortion" and replace with --pre-distortion--.

Signed and Sealed this
Twenty-fourth Day of May, 2016

Michelle K. Lee
*Director of the United States Patent and Trademark Office*

CERTIFICATE OF CORRECTION (continued)
U.S. Pat. No. 9,172,336 B2

In the specification

Column 4, line 15 delete "Ira" and replace with --in--.

Column 4, line 22 delete "predistortion" and replace with --pre-distortion--.

Column 4, line 40 delete "of RF" and replace with --of an RF--.

Column 5, line 21 delete "predistortion" and replace with --pre-distortion--.

Column 5, line 24 delete "predistortion" and replace with --pre-distortion--.

Column 7, line 22 delete "of the A." and replace with --of the PA.--.

Column 8, line 27 delete "SF outputs" and replace with --RF outputs--.

Column 8, line 28 delete "SF voltage" and replace with --RF voltage--.

Column 8, line 30 delete "SF output" and replace with --RF output--.

Column 8, line 37 delete "predistortion" and replace with --pre-distortion--.

Column 8, line 67 delete "power" and replace with --power.--.

Column 9, line 37 delete "cost;" and replace with --cost,--.

Column 9, line 45 delete "switching;"" and replace with --switching,"--.

Column 9, line 46 delete "switching, systems" and replace with --switching," systems--.

Column 11, line 15 delete "(HMO)" and replace with --(MIMO)--.

Column 11, line 33 delete "predistortion" and replace with --pre-distortion--.

Column 11, line 37 delete "predistortion" and replace with --pre-distortion--.

Column 11, line 53 delete "ore-distortion" and replace with --pre-distortion--.

Column 11, line 64 delete "RE outputs," and replace with --RF outputs,--.

Column 12, line 5 delete "RE output." and replace with --RF output.--.

Column 12, line 11 delete "RE drive" and replace with --RF drive--.

Column 12, line 30 delete "RE drive" and replace with --RF drive--.

CERTIFICATE OF CORRECTION (continued)

In the specification

Column 12, line 48 delete "predistortion" and replace with --pre-distortion--.

Column 12, line 51 delete "predistortion" and replace with --pre-distortion--.

Column 12, line 61 delete "predistortion" and replace with --pre-distortion--.

Column 13, line 18 delete "predistorter" and replace with --pre-distorter--.

Column 13, line 18 and 19 delete "predistortion" and replace with --pre-distortion--.

Column 13, line 59 delete "predistortion" and replace with --pre-distortion--.

Column 13, line 66 delete "predistortion" and replace with --pre-distortion--.

Column 14, line 15 delete "predistortion" and replace with --pre-distortion--.

Column 14, line 30 delete "SB DPD" and replace with --SB-DPD--.

Column 15, line 38 delete "together)." and replace with --together.--.

Column 16, line 3 delete "embodiment, (level" and replace with --embodiment, level--.

Column 16, line 63 delete "sequences, in a" and replace with --sequences. In a--.

Column 17, line 55 delete "predistortion" and replace with --pre-distortion--.

Column 17, line 63 delete "to spot the" and replace with --to split the--.

Column 18, line 60 delete "time" and replace with --times--.

Column 19, line 5 delete "$p[n] = -e\square[n]-(G_0[n] + G_1[n]*r[n])$" and replace with --$p[n] = -e\square[n] = -(G_0[n] + G_1[n]*r[n])$--.

Column 19, line 50 delete "Individual" and replace with --individual--.

In the claims

Column 21, line 14 delete "predistortion" and replace with --pre-distortion--.

Column 22, line 16 delete "receive" and replace with --received--.